(12) United States Patent
Kishi et al.

(10) Patent No.: US 11,162,186 B2
(45) Date of Patent: Nov. 2, 2021

(54) QUARTZ GLASS CRUCIBLE, MANUFACTURING METHOD THEREOF, AND MANUFACTURING METHOD OF SILICON SINGLE CRYSTAL USING QUARTZ GLASS CRUCIBLE

(71) Applicant: SUMCO CORPORATION, Tokyo (JP)

(72) Inventors: Hiroshi Kishi, Akita (JP); Kouta Hasebe, Akita (JP); Takahiro Abe, Tokyo (JP); Hideki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 214 days.

(21) Appl. No.: 16/308,797

(22) PCT Filed: Aug. 24, 2017

(86) PCT No.: PCT/JP2017/030266
§ 371 (c)(1),
(2) Date: Dec. 10, 2018

(87) PCT Pub. No.: WO2018/055974
PCT Pub. Date: Mar. 29, 2018

(65) Prior Publication Data
US 2019/0145019 A1    May 16, 2019

(30) Foreign Application Priority Data
Sep. 23, 2016 (JP) .............................. JP2016-185293

(51) Int. Cl.
*C30B 15/10* (2006.01)
*C03B 20/00* (2006.01)
(Continued)

(52) U.S. Cl.
CPC .............. *C30B 15/10* (2013.01); *C03B 20/00* (2013.01); *C30B 29/06* (2013.01); *C30B 15/002* (2013.01)

(58) Field of Classification Search
CPC ....... C03B 20/00; C03C 23/0055; C03C 3/06; C30B 15/002; C30B 15/10; C30B 29/06
See application file for complete search history.

(56) References Cited

U.S. PATENT DOCUMENTS

| 5,976,247 A | 11/1999 | Hansen et al. |
| 5,980,629 A | 11/1999 | Hansen et al. |
(Continued)

FOREIGN PATENT DOCUMENTS

| CN | 1149634 A | 5/1997 |
| DE | 69609907 T2 | 12/2000 |
(Continued)

OTHER PUBLICATIONS

International Search Report (ISR) dated Oct. 24, 2017, issued for International application No. PCT/JP2017/030266.
(Continued)

*Primary Examiner* — Hua Qi
(74) *Attorney, Agent, or Firm* — Law Office of Katsuhiro Arai

(57) ABSTRACT

In an exemplary embodiment, a quartz glass crucible 1 includes: a cylindrical crucible body 10 which has a bottom and is made of quartz glass; and a first crystallization-accelerator-containing coating film 13A which is formed on an inner surface 10a so as to cause an inner crystal layer composed of an aggregate of dome-shaped or columnar crystal grains to be formed on a surface-layer portion of the inner surface 10a of the crucible body 10 by heating during a step of pulling up the silicon single crystal by a Czochralski method. The quartz glass crucible is capable of with-
(Continued)

standing a single crystal pull-up step undertaken for a very long period of time.

4 Claims, 13 Drawing Sheets

(51) Int. Cl.
*C30B 29/06* (2006.01)
*C30B 15/00* (2006.01)

(56) References Cited

U.S. PATENT DOCUMENTS

| | | | |
|---|---|---|---|
| 2002/0076501 A1* | 6/2002 | Costantini | C30B 15/10 427/133 |
| 2003/0012899 A1* | 1/2003 | Kemmochi | B32B 1/02 428/34.6 |
| 2003/0094131 A1* | 5/2003 | Tsujimoto | C30B 15/10 117/95 |
| 2005/0178319 A1 | 8/2005 | Korus et al. | |
| 2008/0092804 A1 | 4/2008 | Hansen et al. | |
| 2012/0006254 A1* | 1/2012 | Fujishiro | C30B 15/10 117/13 |
| 2014/0352605 A1 | 12/2014 | Fallows et al. | |

FOREIGN PATENT DOCUMENTS

| | | | |
|---|---|---|---|
| DE | 60222073 | T2 | 5/2008 |
| DE | 102009013715 | A1 | 9/2010 |
| JP | H0692779 | A * | 4/1994 |
| JP | H082932 | A | 1/1996 |
| JP | H09110590 | A | 4/1997 |
| JP | 2003160393 | A | 6/2003 |
| JP | 2005523229 | A | 8/2005 |
| JP | 2006206342 | A | 8/2006 |
| JP | 2009143770 | A | 7/2009 |
| JP | 2010537945 | A | 12/2010 |
| JP | 2012116702 | A | 6/2012 |
| JP | 2012211082 | A | 11/2012 |
| JP | 2013133243 | A | 7/2013 |

OTHER PUBLICATIONS

A Notice of Reasons for Refusal issued by the Japanese Patent Office, dated Mar. 17, 2020, for counterpart Japanese application No. 2018-540925. (4 pages).

An Office Action issued by the German Patent Office, dated Mar. 25, 2021, for German counterpart application No. 112017004764.1. (7 pages).

* cited by examiner

FIG. 3
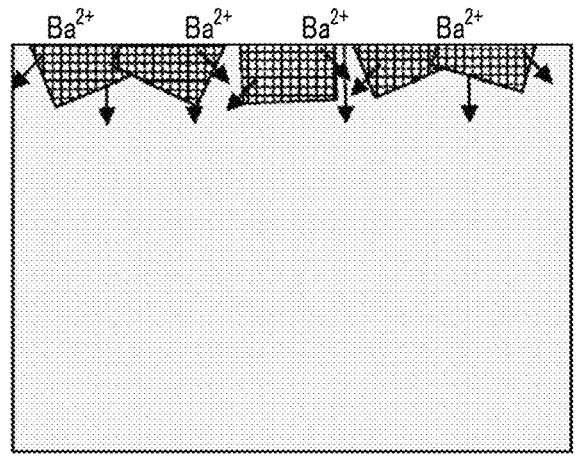
(a)
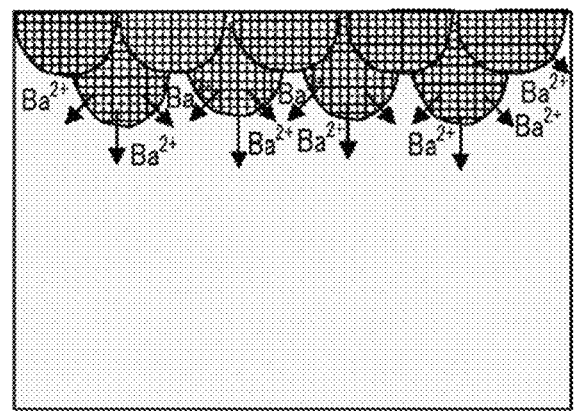
(b)
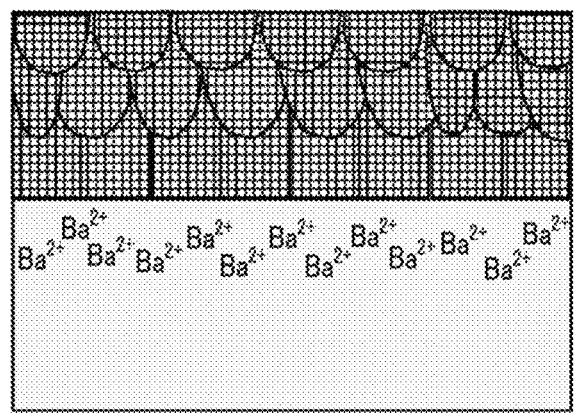
(c)

FIG. 5

| CRYSTAL STRUCTURE | CRUCIBLE | | | | | |
|---|---|---|---|---|---|---|
| | INNER SURFACE | | | OUTER SURFACE | | |
| | W PORTION | R PORTION | B PORTION | W PORTION | R PORTION | B PORTION |
| RANDOM (7.0 OR MORE) | C | C | C | C | C | C |
| DOME-LIKE (0.4 OR MORE AND LESS THAN 7.0) | A | B | B | A | A | A |
| COLUMNAR (LESS THAN 0.4) | | A | A | B | B | B |

FIG. 7
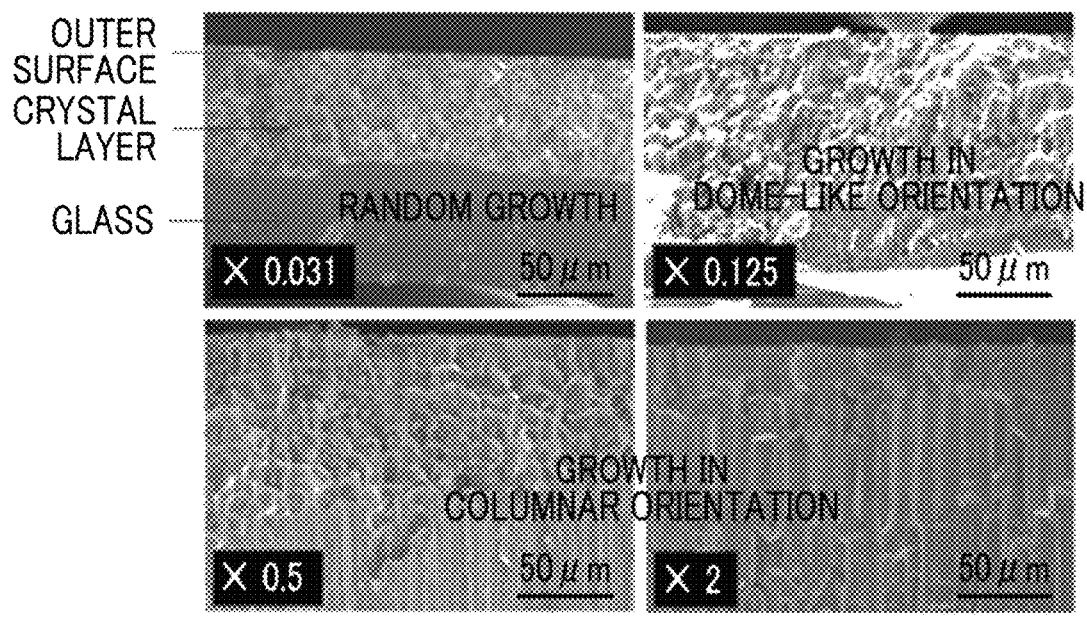
(a)
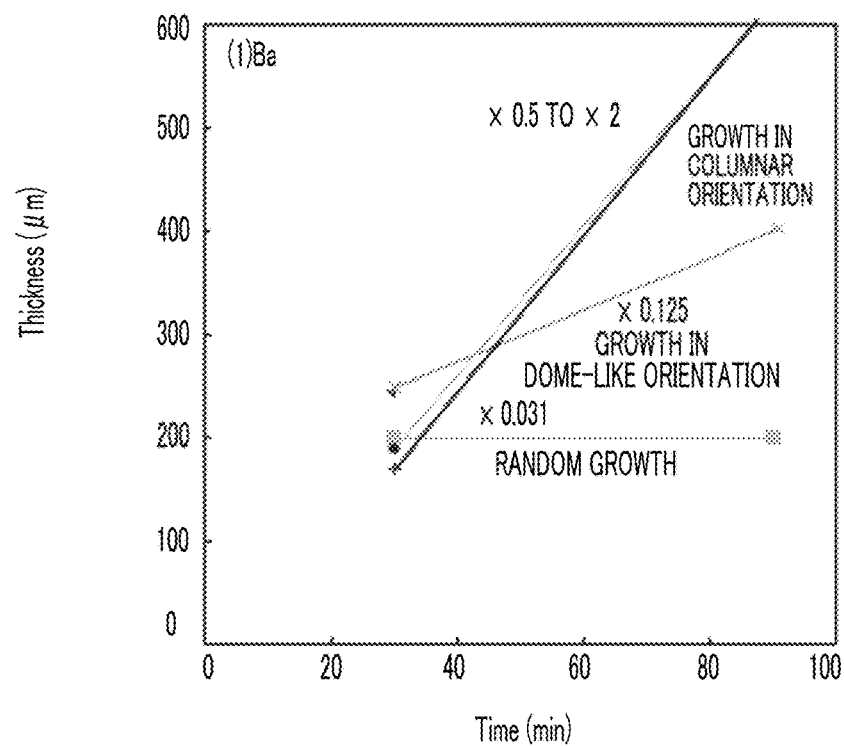
(b)

QUARTZ GLASS CRUCIBLE, MANUFACTURING METHOD THEREOF, AND MANUFACTURING METHOD OF SILICON SINGLE CRYSTAL USING QUARTZ GLASS CRUCIBLE

CROSS-REFERENCE TO RELATED APPLICATIONS

This application is the U.S. National Phase under 35 U.S.C. § 371 of International Application PCT/JP2017/030266, filed Aug. 24, 2017, which claims priority to Japanese Patent Application No. 2016-185293, filed Sep. 23, 2016. The International Application was published under PCT Article 21(2) in a language other than English.

TECHNICAL FIELD

The present invention relates to a quartz glass crucible and a manufacturing method thereof and, particularly to a quartz glass crucible used for manufacturing a silicon single crystal by the Czochralski method (CZ method) and a manufacturing method thereof. In addition, the present invention relates to a manufacturing method of a silicon single crystal using a quartz glass crucible.

BACKGROUND ART

A quartz glass crucible is used for manufacturing a silicon single crystal by the CZ method. In the CZ method, a silicon raw material is heated in the quartz glass crucible for melting, a seed crystal is dipped into the silicon melt, and then the seed crystal is gradually pulled up while rotating the crucible to grow a single crystal. In order to manufacture a high quality silicon single crystal for a semiconductor device at low costs, it is necessary to perform so-called multi-pulling in which not only can the yield of single crystals be increased by a single pull-up step, a plurality of silicon single crystal ingots can be pulled up from a single crucible. For this, a crucible having a stable shape capable of withstanding long-term use is necessary.

In a quartz glass crucible of the related art, the viscosity is reduced in a thermal environment at 1400° C. or higher during pulling up a silicon single crystal, so that the shape thereof cannot be maintained and deformation of the crucible such as buckling or collapse to the inside occurs. Accordingly, variations in the liquid surface level of a silicon melt, breakage of the crucible, contact with components in a furnace, and the like become problems. Furthermore, the inner surface of the crucible is crystallized by coming into contact with the silicon melt during pulling up a single crystal and cristobalite called a brown ring is formed. In a case where the cristobalite is delaminated and incorporated into the silicon single crystal during growth, this causes dislocation.

In order to solve such problems, a method of increasing the strength of a crucible by positively crystallizing the wall surface of the crucible is proposed. For example, Patent Document 1 describes a quartz glass crucible in which a coating film of a crystallization accelerator of elements in group 2a is present in the inner surface of the quartz glass crucible within a depth of 1 mm. When a silicon single crystal is pulled up by using the quartz glass crucible, a crystal layer is formed on the inner surface of the crucible, so that heat resistance property is improved. Therefore, for example, even when a silicon single crystal is pulled up at a reduced pressure, the inner surface does not become rough and is maintained smooth, with the result that pulling up is possible for a long period of time with good crystallization ratio.

In addition, Patent Document 2 describes that a devitrification accelerator such as a barium hydroxide aqueous solution is applied to the inner surface of a crucible, and the crystallization rate is adjusted by changing the concentration of the devitrification accelerator depending on the portion of the crucible, thereby preventing delamination of crystals. The crystallization rates of a corner portion, a wall portion, and a bottom portion are set in descending order, and the devitrification growth rate is set to be in a range of 0.1 to 0.6 μm/h for uniform devitrification.

Patent Document 3 describes a surface treatment method of a quartz glass product such as a quartz glass crucible, in which the inner surface of a crucible is coated with a reducing coating agent (amines, organosilane halogens, or the like) containing a methyl group to accelerate cristobalite formation during pulling, thereby preventing delamination of a devitrification point.

Patent Document 4 describes a quartz glass crucible in which the strength is increased by semi-crystallizing the inner surface. The quartz glass crucible contains a crystallization accelerator in the inner surface of the crucible having a thickness of 1 to 10 μm and a semi-crystal layer having a crystallinity of 80% to 95%. The semi-crystal layer is formed by applying a voltage to a mold during arc melting to move the crystallization accelerator to the inner surface of the quartz glass crucible in a rotating mold method.

Patent Document 5 describes that the outer layer of a side wall of a crucible is formed as a doped region which contains a first components such as Ti acting as a reticulating agent in quartz glass and a second component such as Ba acting as a separation point forming agent in the quartz glass and has a thickness of 0.2 mm or more, and when a quartz glass crucible is heated in a specific usage method for crystal pulling, cristobalite is formed in the doped region to accelerate the crystallization of the quartz glass, thereby increasing the strength of the crucible.

Background Art Literature

Patent Document

Patent Document 1 Japanese Patent Application Laid-Open No. H8-2932
Patent Document 2 Japanese Patent Application Laid-Open No. 2003-160393
Patent Document 3 Japanese Patent Application Laid-Open No. 2010-537945
Patent Document 4 Japanese Patent Application Laid-Open No. 2006-206342
Patent Document 5 Japanese Patent Application Laid-Open No. 2005-523229

SUMMARY OF THE INVENTION

Problems to be Solved by the Invention

However, in the method of strengthening a crucible in the related art described in Patent Documents 1 and 2, there may be cases where the thickness of the crystal layer is insufficient, and delamination of crystal grains occur depending on the crystallization state. That is, when crystals grow in all directions (hereinafter, "random growth") with no regularity in the crystal growth direction in the crystal layer, the crystallization accelerator is trapped in the crystal grain boundary, so that the crystallization rate decreases with time, with the result that the crystal growth in the thickness direction of the crucible is stopped in a relatively early stage in a pull-up step. Therefore, in the pull-up step taken for a very long period of time under high-temperature heat load, such as multi-pulling, there is a problem that a thin crystal layer in the inner surface of the crucible is eroded in the silicon melt and disappears completely.

The method of strengthening a crucible in the related art described in Patent Document 3 focuses only on the density of the brown ring on the surface and does not consider the crystal growth in the thickness direction of the crucible. When the thickness of the crystal layer is not sufficiently secured, there is a problem that the strength of the crucible cannot be maintained and deformation occurs, or delamination of the brown ring generated on the surface of the quartz glass occurs. Furthermore, since the brown ring does not cover the entire inner surface of the crucible, the brown ring does not contribute to an increase in the strength of the crucible.

In the method of strengthening a crucible in the related art described in Patent Documents 4 and 5, since the crystallization accelerator is present in a glass matrix, the crystallization accelerator simultaneously generates crystal nuclei, so that the crystal layer grows randomly. Therefore, there is a problem that the thickness of the crystal layer is insufficient due to a decrease in the crystallization rate. Since there is a possibility that the inner surface of the crucible may be eroded by 1 mm or more during pull up a single crystal, in a case where the crystal layer is thin, there is concern that the crystal layer may disappear in the latter half of the single crystal pull-up step.

Accordingly, an object of the present invention is to provide a quartz glass crucible capable of withstanding a single crystal pull-up step taken for a very long period of time, such as multi-pulling, and a manufacturing method thereof. In addition, the present invention provides a manufacturing method of a silicon single crystal using a quartz glass crucible.

Means for Solving the Problems

The inventors had conducted intensive studies on the mechanism of crystallization of the surface of a crucible at a high temperature in a crystal pull-up step and as a result, found the structure of a crystal layer and particularly the orientation state of crystal grains in the thickness direction of a crucible wall, which enable continuous crystal growth and can prevent disappearance of the crystal layer due to delamination of the crystal layer and erosion into a silicon melt.

The present invention is based on such technical knowledge, and a quartz glass crucible according to a first aspect of the present invention is used for pulling up a silicon single crystal by a Czochralski method, and includes: a cylindrical crucible body which has a bottom and is made of quartz glass; and a first crystallization-accelerator-containing coating film which is formed on an inner surface of the crucible body so as to cause an inner crystal layer composed of an aggregate of dome-shaped or columnar crystal grains to be formed on a surface-layer portion of the inner surface of the crucible body by heating during a step of pulling up the silicon single crystal.

According to the present invention, by causing the crystal structure of the inner crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, it is possible to prevent dislocation of the silicon single crystal caused by delamination of crystal grains (cristobalite) from the inner wall surface of the crucible.

In the present invention, it is preferable that a ratio A/B between a maximum value A of a peak intensity at a diffraction angle 2θ of 20° to 25° and a maximum value B of a peak intensity at a diffraction angle 2θ of 33° to 40° obtained by analyzing the inner surface of the crucible body, on which the inner crystal layer is formed, by an X-ray diffraction method is 7 or less. In a case where the analysis result of the X-ray diffraction method satisfies the above conditions, it can be determined that the inner crystal layer has the crystal structure in a dome-like orientation or columnar orientation. It should be noted that "orientation" refers to an aggregate of crystal grains grown with crystal axes aligned with a certain direction, and "dome-like orientation" refers to a crystal structure in which, when an aggregate of dome-shaped crystal grains is evaluated by XRD (X-ray diffraction), crystal grains with random crystal axis directions and crystal grains grown in an orientation coexist with each other, and orientation is confirmed in a portion of the aggregate of crystal grains.

In the present invention, it is preferable that the inner crystal layer has a dome-shaped crystal layer composed of the aggregate of dome-shaped crystal grains formed on the surface-layer portion of the inner surface of the crucible body, and a columnar crystal layer composed of the aggregate of columnar crystal grains immediately under the dome-shaped crystal layer. When the inner surface of the crucible undergoes crystal growth in a plane, there is concern that crystal grains which have grown largely may be delaminated, which may cause dislocation of the silicon single crystal. However, since the crystal growth of the inner crystal layer is changed from the dome-like orientation to the columnar orientation and the columnar crystal grains grow in the thickness direction, a structure in which the crystal grains are less likely to be delaminated even when the crystal grains grow largely can be achieved, thereby preventing dislocation of the silicon single crystal. In addition, the strength of the crucible can be always increased by allowing crystal growth to continue.

In the present invention, it is preferable that a ratio A/B between a maximum value A of a peak intensity at a diffraction angle 2θ of 20° to 25° and a maximum value B of a peak intensity at a diffraction angle 2θ of 33° to 40° obtained by analyzing the inner surface of the crucible body, on which the inner crystal layer is formed, by an X-ray diffraction method is less than 0.4. In a case where the analysis result of the X-ray diffraction method satisfies the above conditions, it can be determined that the inner crystal layer primarily has the crystal structure in a columnar orientation.

In the present invention, it is preferable that a crystallization accelerator contained in the first crystallization-accelerator-containing coating film is an element that can become divalent cations to form glass with quartz glass, and is particularly preferably barium which growth in an orientation most strongly compared to other elements. In a case where the crystallization accelerator is barium, and a concentration of the barium in the inner surface of the crucible body is preferably $3.9 \times 10^{16}$ atoms/cm$^2$ or more. Accordingly, a countless number of crystal nuclei are generated on the surface of the crucible within a short period of time, so that crystal growth in a columnar orientation can be accelerated from the earliest possible stage.

It is preferable that the quartz glass crucible according to the present invention further includes: a second crystallization-accelerator-containing coating film which is formed on an outer surface of the crucible body so as to cause an outer crystal layer composed of an aggregate of dome-shaped or columnar crystal grains to be formed on a surface-layer portion of the outer surface of the crucible body by heating during the step of pulling up. With this configuration, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

In the present invention, it is preferable that a region having a predetermined width extending downward from a rim upper end of the inner surface of the crucible body is a crystallization accelerator uncoated region in which the first crystallization-accelerator-containing coating film is not formed. Accordingly, the generation of particles of small crystal pieces at the rim upper end can be suppressed, and a reduction in the yield of the silicon single crystal can be prevented.

In the present invention, it is preferable that a ratio A/B between a maximum value A of a peak intensity at a diffraction angle 2θ of 20° to 25° and a maximum value B of a peak intensity at a diffraction angle 2θ of 33° to 40° obtained by analyzing the outer surface of the crucible body, on which the outer crystal layer is formed, by an X-ray diffraction method is 0.4 or more and 7 or less. In a case where the analysis result of the X-ray diffraction method satisfies the above conditions, it can be determined that the outer crystal layer has the crystal structure in a dome-like orientation.

In the present invention, it is preferable that a crystallization accelerator contained in the second crystallization-accelerator-containing coating film is barium, and a concentration of the barium in the outer surface of the crucible body is equal to or more than $4.9 \times 10^{15}$ atoms/cm$^2$ and less than $3.9 \times 10^{16}$ atoms/cm$^2$. Accordingly, crystal growth in a dome-like orientation can be accelerated.

In the present invention, it is preferable that a region having a predetermined width extending downward from a rim upper end of the outer surface of the crucible body is a crystallization accelerator uncoated region in which the second crystallization-accelerator-containing coating film is not formed. Accordingly, the generation of particles of small crystal pieces at the rim upper end can be suppressed, and a reduction in the yield of the silicon single crystal can be prevented.

A quartz glass crucible according to a second aspect of the present invention is used for pulling up a silicon single crystal by a Czochralski method, and includes: a cylindrical crucible body which has a bottom and is made of quartz glass; and a second crystallization-accelerator-containing coating film which is formed on an outer surface of the crucible body so as to cause an outer crystal layer composed of an aggregate of dome-shaped or columnar crystal grains to be formed on a surface-layer portion of the outer surface of the crucible body by heating during a step of pulling up the silicon single crystal.

According to the present invention, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

A ratio A/B between a maximum value A of a peak intensity at a diffraction angle 2θ of 20° to 25° and a maximum value B of a peak intensity at a diffraction angle 2θ of 33° to 40° obtained by analyzing the outer surface of the crucible body, on which the outer crystal layer is formed, by an X-ray diffraction method is preferably 7 or less, and particularly preferably 0.4 or more and 7 or less. In a case where A/B from the analysis result of the X-ray diffraction method is 7 or less, the outer crystal layer can be determined to have the crystal structure in a dome-like orientation or columnar orientation, and can be determined to have a dome-like orientation in a case where A/B is 0.4 or more and 7 or less.

In the present invention, it is preferable that a region having a predetermined width extending downward from a rim upper end of the outer surface of the crucible body is a crystallization accelerator uncoated region in which the second crystallization-accelerator-containing coating film is not formed. Accordingly, the generation of particles of small crystal pieces at the rim upper end can be suppressed, and a reduction in the yield of the silicon single crystal can be prevented.

A manufacturing method of a quartz glass crucible according to a third aspect of the present invention includes: applying a first crystallization accelerator coating solution containing a thickener to an inner surface of the quartz glass crucible so as to cause a concentration of a crystallization accelerator in the inner surface to be $3.9 \times 10^{16}$ atoms/cm$^2$ or more. In this case, it is preferable that the first crystallization accelerator coating solution is applied by a spraying method in a state in which a region having a predetermined width extending downward from a rim upper end in the inner surface of the quartz glass crucible is masked. Furthermore, it is preferable that the manufacturing method of a quartz glass crucible according to the present invention further includes: applying a second crystallization accelerator coating solution containing the thickener to an outer surface of the quartz glass crucible so as to cause the concentration of the crystallization accelerator in the outer surface to be equal to or more than $4.9 \times 10^{15}$ atoms/cm$^2$ and less than $3.9 \times 10^{16}$ atoms/cm$^2$. In this case, it is preferable that the second crystallization accelerator coating solution is applied by the spraying method in a state in which an opening of the quartz glass crucible is sealed and a region having a predetermined width extending downward from the rim upper end in the outer surface of the quartz glass crucible is masked. As described above, the inner crystal layer in the columnar orientation can be formed on the inner surface of the crucible, and the outer crystal layer in the dome-like orientation can be formed on the outer surface of the crucible.

A manufacturing method of a quartz glass crucible according to a fourth aspect of the present invention includes: applying a crystallization accelerator coating solution to a surface of a quartz glass base material; forming a crystal layer on a surface-layer portion of the surface of the quartz glass base material by an evaluation heat treatment at 1400° C. or higher; analyzing a crystallized state of the surface of the quartz glass base material by an X-ray diffraction method, and adjusting a concentration of a crystallization accelerator in the crystallization accelerator coating solution based on an analysis result; and applying the adjusted crystallization accelerator coating solution to a surface of the quartz glass crucible.

Crystal grains in a dome-like orientation or a columnar orientation can be grown by causing the crystallization accelerator to be present at a high density at the interface between quartz glass and the crystal grains. However, the degree of density at which the crystallization accelerator is present by applying the crystallization accelerator coating solution to the surface of the quartz glass crucible is unclear. However, by checking in advance the action of the crystallization accelerator coating solution using the quartz glass base material, problems such as deformation of the quartz glass crucible in an actual pull-up step can be prevented in advance.

According to a fifth aspect of the present invention, a manufacturing method of a silicon single crystal by a Czochralski method in which a silicon single crystal is pulled up from a silicon melt in a quartz glass crucible, includes: applying a first crystallization accelerator coating solution to an inner surface of the quartz glass crucible; forming, on a surface-layer portion of the inner surface of the quartz glass crucible, an inner crystal layer having a laminated structure of a dome-shaped crystal layer composed of an aggregate of dome-shaped crystal grains and a columnar crystal layer composed of an aggregate of columnar crystal grains immediately under the dome-shaped crystal layer, by heating in a step of pulling up the silicon single crystal; and pulling up the silicon single crystal while allowing growth of the inner crystal layer to continue.

According to the present invention, by causing the crystal structure of the inner crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, it is possible to prevent dislocation of the silicon single crystal caused by delamination of crystal grains (cristobalite) from the inner wall surface of the crucible.

In the present invention, it is preferable that a ratio A/B between a maximum value A of a peak intensity at a diffraction angle 2θ of 20° to 25° and a maximum value B of a peak intensity at a diffraction angle 2θ of 33° to 40° obtained by analyzing the inner surface of the quartz glass crucible, on which the inner crystal layer is formed, by an X-ray diffraction method is less than 0.4. In a case where the analysis result of the X-ray diffraction method satisfies the above conditions, it can be determined that the inner crystal layer primarily has the crystal structure in a columnar orientation.

In the present invention, it is preferable that a crystallization accelerator contained in the first crystallization accelerator coating solution is barium, and a concentration of the barium applied to the inner surface is $3.9 \times 10^{16}$ atoms/cm$^2$ or more. Accordingly, a countless number of crystal nuclei are generated on the surface of the crucible within a short period of time, so that crystal growth in a columnar orientation can be accelerated from the earliest possible stage.

In the present invention, it is preferable that the first crystallization accelerator coating solution is applied to a region excluding a region having a predetermined width extending downward from a rim upper end in the inner surface of the quartz glass crucible. Accordingly, the generation of particles of small crystal pieces at the rim upper end can be suppressed, and a reduction in the yield of the silicon single crystal can be prevented.

It is preferable that the manufacturing method of a silicon single crystal according to the present invention further includes: applying a second crystallization accelerator coating solution is applied to an outer surface of the quartz glass crucible; forming an outer crystal layer composed of an aggregate of dome-shaped crystal grains on a surface-layer portion of the outer surface of the quartz glass crucible by heating in the step of pulling up the silicon single crystal; and pulling up the silicon single crystal without allowing growth of the outer crystal layer to continue.

Accordingly, by causing the crystal structure of the outer crystal layer to have orientation, crystallization is accelerated, so that the crystal layer having a thickness that does not cause deformation in the crucible wall can be formed. Therefore, it is possible to prevent deformation of the crucible caused during the pull-up step taken for a very long period of time, such as multi-pulling. In addition, since the outer crystal layer can have an appropriate thickness according to the pull-up time, it is possible to prevent foaming and delamination from the quartz glass interface of the outer crystal layer.

In the present invention, it is preferable that a ratio A/B between a maximum value A of a peak intensity at a diffraction angle 2θ of 20° to 25° and a maximum value B of a peak intensity at a diffraction angle 2θ of 33° to 40° obtained by analyzing the outer surface of the quartz glass crucible, on which the outer crystal layer is formed, by an X-ray diffraction method is 0.4 or more and 7 or less. In a case where the analysis result of the X-ray diffraction method satisfies the above conditions, it can be determined that the outer crystal layer has the crystal structure in a dome-like orientation.

In the present invention, it is preferable that a crystallization accelerator contained in the second crystallization-accelerator-containing coating solution is barium, and a concentration of the barium applied to the outer surface is equal to or more than $4.9 \times 10^{15}$ atoms/cm$^2$ and less than $3.9 \times 10^{16}$ atoms/cm$^2$. Accordingly, crystal growth in a dome-like orientation can be accelerated.

In the present invention, it is preferable that the second crystallization accelerator coating solution is applied to a region excluding a region having a predetermined width extending downward from the rim upper end in the outer surface of the quartz glass crucible. Accordingly, the generation of particles of small crystal pieces at the rim upper end can be suppressed, and a reduction in the yield of the silicon single crystal can be prevented.

In the present invention, it is preferable that the first and second crystallization accelerator coating solutions further contain a thickener. Accordingly, the viscosity of the coating solution can be increased, so that it is possible to prevent the coating solution from flowing with gravity, and the like when applied to the crucible and becoming uneven. In addition, since the crystallization accelerator does not cohere in the coating solution but diffuses, so that it is possible to uniformly apply the crystallization accelerator to the surface of the crucible. Therefore, the crystallization accelerator at a high concentration can be uniformly and densely fixed to the wall surface of the crucible, thereby accelerating the growth of crystal grains in a columnar orientation or a dome-like orientation.

In the manufacturing method of a silicon single crystal according to the present invention, it is preferable that a crystallized state of the inner crystal layer formed by heating in the step of pulling up is analyzed, and based on an analysis result, a concentration of the crystallization accelerator in the first crystallization accelerator coating solution applied to an inner surface of a new quartz glass crucible used in a subsequent step of pulling up a silicon single crystal is adjusted. Accordingly, the crystallized state of the inner surface of the crucible used can be evaluated and fed back to the quality of a subsequent quartz glass crucible, thereby improving the durability and reliability of the crucible.

In the manufacturing method of a silicon single crystal according to the present invention, it is preferable that a crystallized state of the outer crystal layer formed by heating in the step of pulling up is analyzed, and based on an analysis result, a concentration of the crystallization accelerator in the second crystallization accelerator coating solution applied to an outer surface of a new quartz glass crucible used in a subsequent step of pulling up a silicon single crystal is adjusted. Accordingly, the crystallized state of the inner surface of the crucible used can be evaluated and fed back to the quality of a subsequent quartz glass crucible, thereby improving the durability and reliability of the crucible.

Effects of the Invention

According to the present invention, it is possible to provide a quartz glass crucible capable of withstanding a single crystal pull-up step taken for a very long period of time, such as multi-pulling, and a manufacturing method thereof. According to the present invention, it is possible to provide a manufacturing method of a silicon single crystal using the quartz glass crucible.

BRIEF DESCRIPTION OF DRAWINGS

FIGS. 3(a) to (c) are schematic views for explaining a mechanism of crystallization of the surface-layer portion of the crucible by a crystallization accelerator.

FIG. 4 shows graphs showing measurement results of the surface-layer portion of the crucible by a surface X-ray diffraction method, in which FIGS. 4(a), 4(b), and 4(c) show crystal layers in a random orientation, in a dome-like orientation, and in a columnar orientation, respectively.

FIG. 5 is a table showing suitable crystal structures of an inner crystal layer 14A and an outer crystal layer 14B for each part.

FIG. 7(a) is an image showing SEM observation results, and FIG. 7(b) is a graph showing the relationship between the heating time of a quartz glass plate and the thickness of a crystal layer formed on the surface-layer portion of the quartz glass plate.

DETAILED DESCRIPTION OF THE EMBODIMENTS

Preferred embodiments of the present invention will be described in detail below with reference to the accompanying drawings.

Figure 1:
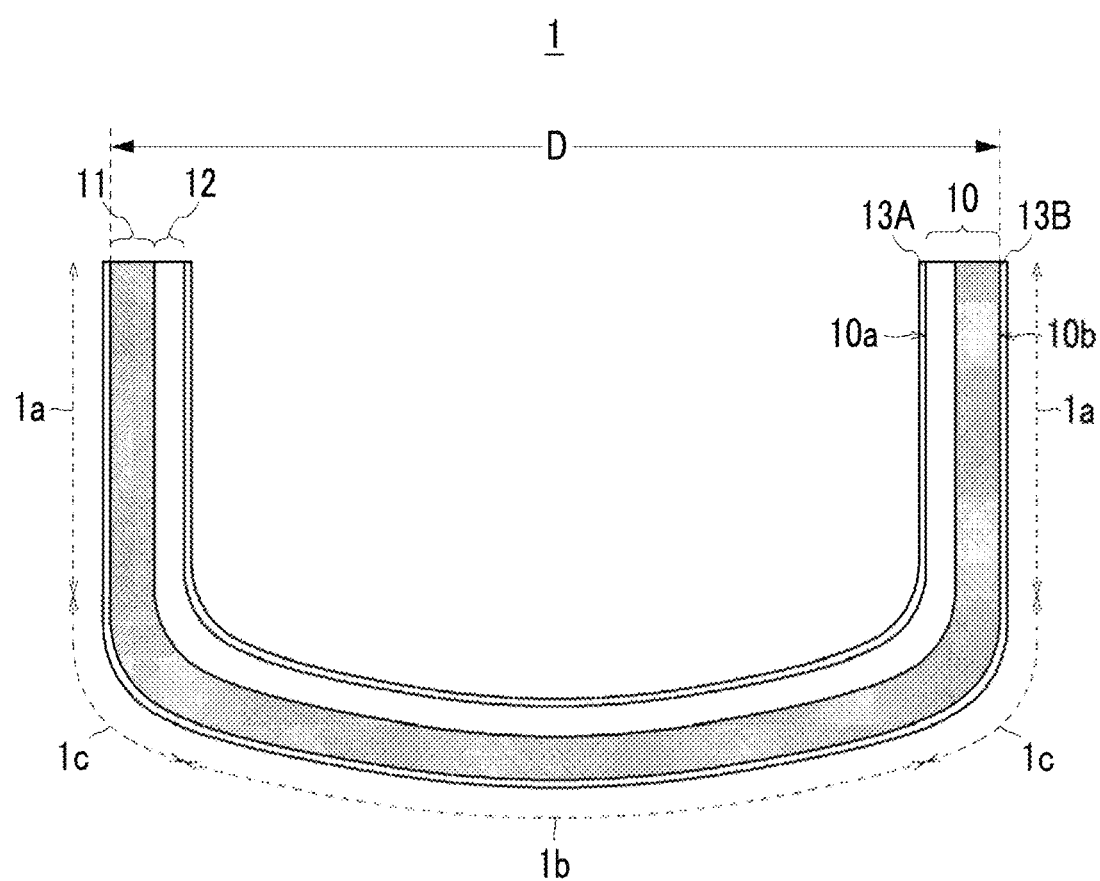
FIG. 1 is a schematic cross-sectional view illustrating the structure of a quartz glass crucible according to a first embodiment of the present invention.

FIG. 1 is a schematic cross-sectional view illustrating the structure of a quartz glass crucible 1 according to a first embodiment of the present invention.

As illustrated in FIG. 1, a quartz glass crucible 1 is a cylindrical container having a bottom for supporting a silicon melt, and includes a straight body portion 1a having a cylindrical shape, a bottom portion 1b which is gently curved, and a corner portion 1c which has a larger curvature than the bottom portion 1b and connects the straight body portion 1a to the bottom portion 1b.

The diameter D (aperture) of the quartz glass crucible 1 is 24 inches (about 600 mm) or more and is preferably 32 inches (about 800 mm) or more. This is because such a crucible having a large aperture is used for pulling up a large-size silicon single crystal ingot having a diameter of 300 mm or more and is required to be less likely to be deformed even when used for a long period of time. In recent years, with an increase in the size of a crucible due to an increase in the size of a silicon single crystal and an increase in the time for a pull-up step, the thermal environment of the crucible has become more severe, and the improvement in the durability of a large crucible is an extremely important issue. Although the thickness of the crucible slightly varies depending on its part, the thickness of the straight body portion 1a of a crucible of 24 inches or more is preferably 8 mm or more, the thickness of the straight body portion 1a of a large crucible of 32 inches or more is preferably 10 mm or more, and the thickness of the straight body portion 1a of a large crucible of 40 inches (about 1000 mm) or more is more preferably 13 mm or more.

The quartz glass crucible 1 has a two-layer structure, and includes an opaque layer 11 (bubble layer) made of quartz glass containing a large number of minute bubbles, and a transparent layer 12 (bubble-free layer) made of quartz glass with substantially no bubbles contained therein.

The opaque layer 11 is provided in order to heat the silicon melt in the crucible as uniformly as possible without radiant heat from a heater of a single crystal pull-up apparatus being transmitted through the crucible wall. Therefore, the opaque layer 11 is provided in the entire crucible ranging from the straight body portion 1a to the bottom portion 1b of the crucible. The thickness of the opaque layer 11 is a value obtained by subtracting the thickness of the transparent layer 12 from the thickness of the crucible wall, and varies depending on the part of the crucible.

The bubble content rate in the quartz glass forming the opaque layer 11 is 0.8% or more, and preferably 1% to 5%. The bubble content rate of the opaque layer 11 can be obtained by specific gravity measurement (Archimedes' method). When an opaque quartz glass piece of unit volume (1 cm$^3$) is cut out from a crucible and the mass thereof is referred to as A, and the specific gravity of the quartz glass with no bubbles contained therein (true density of quartz glass) is referred to as B=2.2 g/cm$^3$, the bubble content rate P (%) is P=(B−A)/B×100.

The transparent layer 12 is a layer forming the inner surface of the crucible wall which is in contact with the silicon melt, is required to be highly pure in order to prevent contamination of the silicon melt, and is provided in order to, if bubbles are contained, prevent dislocation of a single crystal due to crucible fragments and the like when the bubbles burst. The thickness of the transparent layer 12 is preferably 0.5 to 10 mm, and is set to an appropriately thickness for each part of the crucible so as not to cause the opaque layer 11 to be exposed due to the transparent layer 12 being completely removed by erosion during a single crystal pull-up step. Similar to the opaque layer 11, it is preferable that the transparent layer 12 is provided over the entire crucible from the straight body portion 1a to the bottom portion 1b of the crucible. However, in the upper end portion (rim portion) of the crucible which is not in contact with the silicon melt, it is also possible to omit formation of the transparent layer 12.

"With substantially no bubbles contained" in the transparent layer 12 means a bubble content rate at which the single crystallinity is not decreased by crucible fragments when bubbles burst, and means that the bubble content rate is 0.8% or less and the average diameter of the bubbles is 100 µm or less. A change in the bubble content rate at the boundary between the opaque layer 11 and the transparent layer 12 is steep, and the boundary between the two is apparent with the naked eye.

The bubble content rate of the transparent layer 12 can be measured nondestructively using optical detecting means. The optical detecting means includes a light receiving device which receives the reflected light of the light irradiating the inner surface of a crucible to be inspected. Irradiation light emitting means may be built in or external light emitting means may also be used. In addition, as the optical detecting means, one that can be turned along the inner surface of the quartz glass crucible is preferably used. As the irradiation light, X-rays, laser light, and the like as well as visible light, ultraviolet light, and infrared light can be used, and any light can be applied as long as the light can be reflected for bubble detection. The light receiving device is selected according to the type of the irradiation light, and for example, an optical camera including a light receiving lens and an imaging unit can be used.

Measurement results by the optical detecting means are received by an image processing device to calculate the bubble content rate. Specifically, an image of the inner surface of the crucible is taken using the optical camera, the inner surface of the crucible is divided into predetermined areas as reference areas S1, an area S2 occupied by bubbles is obtained for each reference area S1, and the bubble content rate P (%) is calculated by P=(S2/S1)×100. In order to detect bubbles present at a constant depth from the surface of quartz glass, the focal point of a light receiving lens may be scanned in a depth direction from the surface. A plurality of images is taken in this manner, and the bubble content rate in a space may be obtained on the basis of the bubble content rate of each of the images.

The quartz glass crucible 1 according to the embodiment includes a crucible body 10 made of quartz glass, and first and second crystallization-accelerator-containing coating films 13A and 13B respectively formed on an inner surface 10a and an outer surface 10b of the crucible body 10. Such coating films play a role in accelerating crystallization of the surface-layer portion of the crucible body 10 by heating in a step of pulling up a silicon single crystal. Typically, the inner surface 10a of the crucible body 10 serves as the surface of the transparent layer 12, the outer surface 10b serves as the surface of the opaque layer 11, and the first crystallization-accelerator-containing coating film 13A and the second crystallization-accelerator-containing coating film 13B are respectively formed on the transparent layer 12 and the opaque layer 11. The crystallization-accelerator-containing coating films 13A and 13B contain a water-soluble polymer acting as a thickener, whereby a hard film is formed on the surface of the crucible body 10.

The thickness of the crystallization-accelerator-containing coating films 13A and 13B is preferably 0.3 to 100 µm. Accordingly, the concentration of barium applied thereto is controlled by changing the thickness of the crystallization-accelerator-containing coating films 13A and 13B. It should be noted that elements that can act as a crystallization accelerator are not intentionally added to the crucible body 10 made of quartz glass, and for example, in a case where the crucible body 10 is formed of natural quartz powder, it is preferable that the concentration of barium is less than 0.10 ppm, the concentration of magnesium is less than 0.10 ppm, and the concentration of calcium is less than 2.0 ppm. In a case of using synthetic quartz powder as the constituent raw material of the inner surface the crucible body 10, it is preferable that the concentrations of both magnesium and calcium contained in the crucible body 10 are less than 0.02 ppm.

The crystallization accelerator contained in the crystallization-accelerator-containing coating films 13A and 13B is an element in group 2a, and examples thereof include magnesium, calcium, strontium, and barium.

However, barium is particularly preferable because it has a small segregation coefficient on silicon, does not attenuate in crystallization rate with crystallization, and causes orientation growth most strongly compared with other elements. The crystallization-accelerator-containing coating films 13A and 13B can be formed by applying a coating solution containing barium to the wall surface of the crucible.

The coating solution containing barium may be a coating solution containing a barium compound and water, or may be a coating solution which does not contain water but contains anhydrous ethanol and a barium compound. Examples of the barium compound include barium carbonate, barium chloride, barium acetate, barium nitrate, barium hydroxide, barium oxalate, and barium sulfate. It should be noted that if the surface concentration (atoms/cm$^2$) of the barium element is the same, the crystallization acceleration effect is also the same regardless of being insoluble or being water-soluble. However, since barium which is insoluble in water is less likely to be taken into the human body, it is highly safe and is advantageous in terms of handling.

It is preferable that the coating solution containing barium further contains a highly viscous water-soluble polymer (thickener) such as carboxyvinyl polymer. In a case of using a coating solution without a thickener contained therein, fixing of barium to the wall surface of the crucible is instable, so that a heat treatment for fixing barium is necessary. When such a heat treatment is performed, barium diffuses and penetrates into the quartz glass, and becomes the cause of acceleration of random growth of crystal, which will be described later. However, in a case of using a coating solution containing a thickener together with barium, the viscosity of the coating solution increases, so that it is possible to prevent the coating solution from flowing with gravity when applied to the crucible and thus becoming uneven. Furthermore, regarding the barium compound such as barium carbonate, in a case where the coating solution contains the water-soluble polymer, the barium compound does not cohere in the coating solution but diffuses, so that it is possible to uniformly apply the barium compound to the surface of the crucible. Therefore, barium at a high concentration can be uniformly and densely fixed to the wall surface of the crucible, thereby accelerating the growth of crystal grains in a columnar orientation or a dome-like orientation.

Examples of the thickener include water-soluble polymers containing a small amount of metallic impurities such as polyvinyl alcohol, a cellulosic thickener, high purity glucomannan, an acrylic polymer, a carboxyvinyl polymer, and a polyethylene glycol fatty acid ester. In addition, an acrylic acid-alkyl methacrylate copolymer, polyacrylate, polyvinyl carboxylic acid amide, vinylcarboxylic acid amide, or the like may also be used as the thickener. The viscosity of the coating solution containing barium is preferably in a range of 100 to 10000 mPa·s, and the boiling point of the solvent is preferably 50 to 100° C.

For example, a crystallization accelerator coating solution for coating the outer surface of a 32-inch crucible contains 0.0012 g/mL of barium carbonate and 0.0008 g/mL of a carboxyvinyl polymer, and can be produced by adjusting the ratio between ethanol and pure water and mixing and stirring the mixture therein.

Application of the crystallization accelerator coating solution to the surface of the crucible can be performed by a brush or a spray. After the application, water and the like evaporate such that a hard film is formed by the thickener. It should be noted that in a method of the related art, after applying water or alcohols containing barium carbonate, the crucible is heated to 200 to 300° C. for the purpose of suppressing delamination. Due to the heating, barium on the surface diffuses to the inside, crystal nuclei are simultaneously generated, so that random growth is necessarily incurred. Therefore, the coating film should not be heated before pulling after the application.

Figure 2:
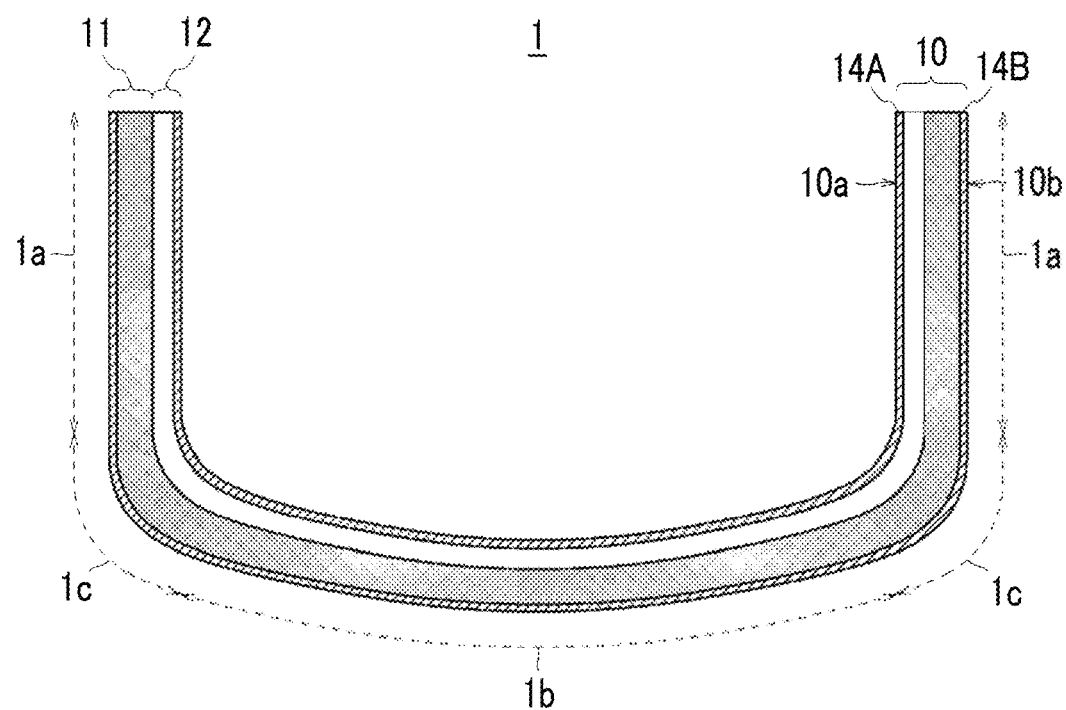
FIG. 2 is a schematic cross-sectional view illustrating the structure of the quartz glass crucible in a state in which the surface is crystallized by heating.

FIG. 2 is a schematic cross-sectional view illustrating the structure of the quartz glass crucible 1 in a state in which the surface is crystallized by heating.

As illustrated in FIG. 2, the surface of the quartz glass crucible to which the crystallization accelerator is applied is heated during the step of pulling up a silicon single crystal such that the crystallization of the quartz glass is accelerated, with the result that an inner crystal layer 14A and an outer crystal layer 14B are respectively formed on the inner surface 10a and an outer surface 10b of the crucible body 10. Heating during the step of pulling up a silicon single crystal is performed even for several tens of hours or longer at a temperature of the melting point of silicon (about 1400° C.) or higher. However, how the crystal layer is formed on the surface-layer portion of the crucible body 10 can be evaluated, as well as by actually performing the step of pulling up a silicon single crystal, by performing a heat treatment at a temperature equal to or higher than 1400° C. and equal to or lower than the softening point of silica glass for 1.5 hours or longer.

It is preferable that the crystallized state of the inner crystal layer 14A has a single layer of a dome-shaped crystal layer or a two-layer structure of a dome-shaped crystal layer and a columnar crystal layer (hereinafter, referred to as dome-shaped/columnar crystal layer). In particular, in a case where the use time of the crucible is very long, the inner crystal layer 14A is preferably a dome-shaped/columnar crystal layer, and in a case where the use time of the crucible is relatively short, the inner crystal layer 14A may have a single-layer structure consisting solely of a dome-shaped crystal layer. Here, the dome-shaped crystal layer refers to a crystal layer composed of an aggregate of dome-shaped crystal grains, and the columnar crystal layer refers to a crystal layer composed of an aggregate of columnar crystal grains.

The thickness of the inner crystal layer 14A capable of suppressing the deformation of the crucible is 200 µm or more, and particularly 400 µm or more. The inner crystal layer 14A which is in contact with the silicon melt during pulling up a single crystal is gradually eroded. However, since the columnar crystal layer gradually grows, it is also possible to maintain the thickness of the inner crystal layer 14A at 400 µm or more. In addition, the degree of the thickness of the inner crystal layer 14A at which the deformation of the crucible can be suppressed can be easily evaluated by a so-called beam bending method using a quartz glass crucible piece having a crystal layer formed therein.

The crystallized state of the outer crystal layer 14B is preferably has a single-layer structure of the dome-shaped crystal layer. Although described later in detail, this is because crystal growth continues in the dome-shaped/columnar crystal layer such that the thickness the outer crystal layer 14B increases and forming and delamination is likely to occur at the interface between the crystal layer and the quartz glass layer. However, in a case where the use time of the crucible is relatively short and the outer crystal layer does not become excessively thick, the outer crystal layer 14B may have a structure consisting of the dome-shaped/columnar crystal layer.

As described above, since the inner surface of the crucible is covered with the crystal layer, erosion of the crucible can be suppressed, and dislocation of the silicon single crystal due to delamination of crystal grains can be prevented. Furthermore, since the outer surface of the crucible is crystallized, the strength of the crucible can be increased, and deformation of the crucible such as buckling or collapse to the inside can be suppressed.

FIGS. 3(a) to 3(c) are schematic views for explaining a mechanism of crystallization of the surface-layer portion of the crucible by the crystallization accelerator.

As illustrated in FIG. 3(a), in a case where barium (Ba) as the crystallization accelerator is present on the surface of the crucible (quartz glass interface) and the concentration of Ba ions ($Ba^{2+}$) from ionized barium is lower than the concentration of Si ions ($Si^{4+}$), the amount of crystal nuclei initially generated on the surface of the crucible is small, so that random crystal growth on the crystal nuclei occurs. Here, the Ba ions are trapped in the crystal grain boundaries, so that the amount of Ba ions which are present at the interface between the quartz glass and the crystal grains and thus contribute to the crystal growth in the thickness direction of the crucible decreases. Accordingly, the crystal growth gradually weakens and stops soon.

However, as illustrated in FIG. 3(b), in a case where the concentration of the Ba ions is higher than the concentration of the Si ions, a large amount of crystal nuclei are generated on the surface of the crucible, and crystals competitively grow on the crystal nuclei as the origins, so that crystal grains in a dome-like orientation are formed. When the crystallization further proceeds, only crystals in a vertical orientation survive in the competing process. However, the Ba ions are trapped in the crystal grain boundaries, so that the amount of Ba ions which are present at the interface between the quartz glass and the crystal grains decreases. Accordingly, the crystal growth gradually weakens and stops soon. However, with the crystal layer in the dome-like orientation, it is possible to form a crystal layer sufficiently thicker than a crystal layer in a random orientation.

In addition, in a structure in which Ba ions are present in a glass matrix in the related art, Ba ions simultaneously generate crystal nuclei. However, the crystals grow randomly, and the amount of Ba ions contributing to crystal growth in the thickness direction decreases. Therefore, the crystal layer cannot be made thick. Contrary to this, as illustrated in FIG. 3(b), in a model in which crystal nuclei start growing uniformly in the depth direction from the glass surface, crystals in a vertical orientation do not cancel out, so that it is possible to form a thick crystal layer.

Furthermore, as illustrated in FIG. 3(c), in a case where the concentration of Ba ions is very high and particularly 50 times or more the concentration of Si ions on the surface of quartz glass, a countless number of crystal nuclei are generated on the surface of the crucible within a short period of time, and selective crystal growth in a vertical direction occurs fast, so that crystal grains in a columnar orientation are formed. As the crystal grains grow, Ba ions are less likely to be trapped in the crystal grain boundaries, and a decrease in the amount of Ba ions is suppressed, so that a decrease in the crystallization rate is suppressed. As described above, by allowing Ba ions to be present at a high concentration on the extreme surface of the quartz glass to advance crystallization at once in the direction toward the inside of the glass, it is possible to turn the crystal structure from the dome-like orientation into the columnar orientation. With the crystal layer in the columnar orientation, crystal growth of the surface-layer portion of the crucible can be allowed to continue, so that it is possible to form a crystal layer which is thickener than the crystal layer in the dome-like orientation.

Since the crystal layer of the inner surface of the crucible is melted by the reaction with the silicon melt, during random growth in which crystallization of quartz glass stops in an initial stage of heating, the crystal layer of the inner surface of the crucible disappears, which is not suitable for long-term use. In addition, since the crystal layer of the outer surface of the crucible also decreases in thickness due to the reaction with a carbon susceptor, there is concern that the crystal layer of the outer surface may disappear during random growth in which crystallization stops in an initial stage of heating. However, the crystal growth period can be increased in the case of dome-like growth, and the thickness of the crystal layer can be sufficiently secured. In addition, the crystal growth period can be further increased in the case of columnar growth, and continuous crystal growth can be realized.

The crystallized state of the surface-layer portion of the crucible can be observed using a SEM (Scanning Electron Microscope)), but can also be evaluated by a surface X-ray diffraction method.

Figure 4:
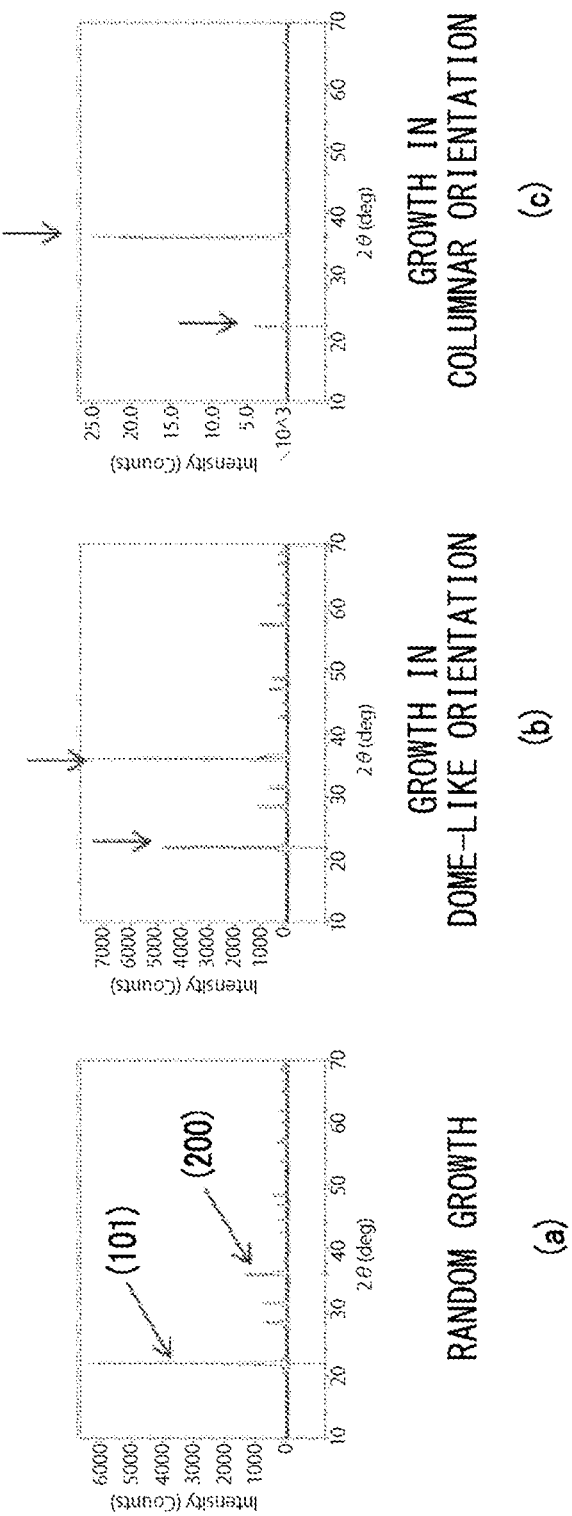

FIG. 4 shows graphs showing measurement results of the surface-layer portion of the crucible by the surface X-ray diffraction method, in which FIGS. 4(a), 4(a), and 4(c) show crystal layers in a random orientation, in a dome-like orientation, and in a columnar orientation, respectively.

In a case where the crystal layer is in a random orientation, as illustrated in FIG. 4(a), the maximum value A of the peak intensity (counts) at a diffraction angle 2θ of 20° to 25° caused by a (100) crystal orientation is very high, and the maximum value B of the peak intensity at a diffraction angle 2θ of 33° to 40° caused by a (200) crystal orientation is very low, and the peak intensity ratio A/B becomes larger than 7.

Contrary to this, in a case where the crystal layer is in the dome-like orientation, as illustrated in FIG. 4 (b), the difference between the maximum value A of the peak intensity at a diffraction angle 2θ of 20° to 25° and the maximum value of the peak intensity at a diffraction angle 2θ of 33° to 40° decreases, and the peak intensity ratio A/B becomes 0.4 or more and 7 or less.

Furthermore, in a case where the crystal layer is in the columnar orientation, as illustrated in FIG. 4(c), the maximum value A of the peak intensity at a diffraction angle 2θ of 20° to 25° is very low, and the maximum value B of the peak intensity at a diffraction angle 2θ of 33° to 40° is very high, and the peak intensity ratio A/B becomes less than 0.4.

FIG. 5 is a table showing suitable crystal structures of the inner crystal layer 14A and the outer crystal layer 14B for each part, in which a preferable crystal structure for each part is indicated by "B", and a more preferable crystal structure is indicated by "A".

As shown in FIG. 5, regarding the inner surface 10a of the crucible body 10, the entire inner surface from the straight body portion (W portion) 1a to the bottom portion (B portion) 1b may be caused to have a dome-shaped/columnar crystal layer (A/B is less than 0.4). In addition, only the corner portion (R portion) 1c and the bottom portion 1b can be caused to have a dome-shaped/columnar crystal layer while the inner surface of the straight body portion 1a is caused to have a dome-shaped crystal layer (A/B is equal to or more than 0.4 and less than 7). This is because the inner surface of the straight body portion 1a has a shorter contact time with the silicon melt than that of the corner portion 1c or the bottom portion 1b and it is sufficient to form a dome-shaped crystal layer thereon. In a case where a crystal pull-up time is relatively short, it is also preferable to adopt the condition that the inner surface of the straight body portion 1a of the crucible body 10 becomes a dome-shaped crystal layer. The thickness of the crystallization-accelerator-containing coating film 13A in the straight body portion 1a can be reduced, so that the incorporation of impurities contained in the coating film into the silicon melt can be reduced.

Regarding the outer surface 10b of the crucible body 10, the entire outer surface from the straight body portion 1a to the bottom portion 1b may have a dome-shaped/columnar crystal layer or a dome-shaped crystal layer regardless of the part of the crucible, but particularly preferably has a dome-shaped crystal layer. This is because, although the strength of the crucible can be increased by allowing the outer crystal layer 14B to have a certain thickness, when the thickness of the outer crystal layer 14B increases, bubbles in a bubble layer of the crystallized quartz glass cohere and expand, with the result that deformation of the crucible or delamination of the crystal layer easily occurs. When the thickness of the outer crystal layer 14B becomes 1.5 mm or more, delamination of the outer crystal layer 14B particularly easily occurs. Therefore, it is preferable that the crystal growth rate of the outer crystal layer 14B flows down as the crystal growth thereof proceeds, and it is preferable that the thickness of the outer crystal layer 14B is suppressed to be less than 1.5 mm.

It is preferable that the coating solution used for forming the crystallization-accelerator-containing coating films 13A and 13B is used in an actual quartz glass crucible after a test for a crystallized state is conducted in advance on a base material such as a quartz glass plate. In the test for a crystallized state, after a crystallization accelerator coating solution at a predetermined concentration is applied to the surface of the quartz glass base material, an evaluation heat treatment is performed at 1400° C. or higher to form a crystal layer on a surface-layer portion of the surface of the quartz glass base material. Next, the crystallized state of the surface of the quartz glass base material is analyzed by the X-ray diffraction method, and the concentration of the crystallization accelerator in the crystallization accelerator coating solution is adjusted based on the analysis result. Then, the crystallization accelerator coating solution after the adjustment of the concentration is applied to the surface of the quartz glass crucible (the crucible body 10), thereby completing the quartz glass crucible 1. As described above, a desired crystallized state can be reliably reproduced regardless of slight differences in conditions such as the concentration, composition, coating conditions, and the like of the crystallization accelerator coating solution, thereby realizing a quartz glass crucible having high reliability.

Figure 6:
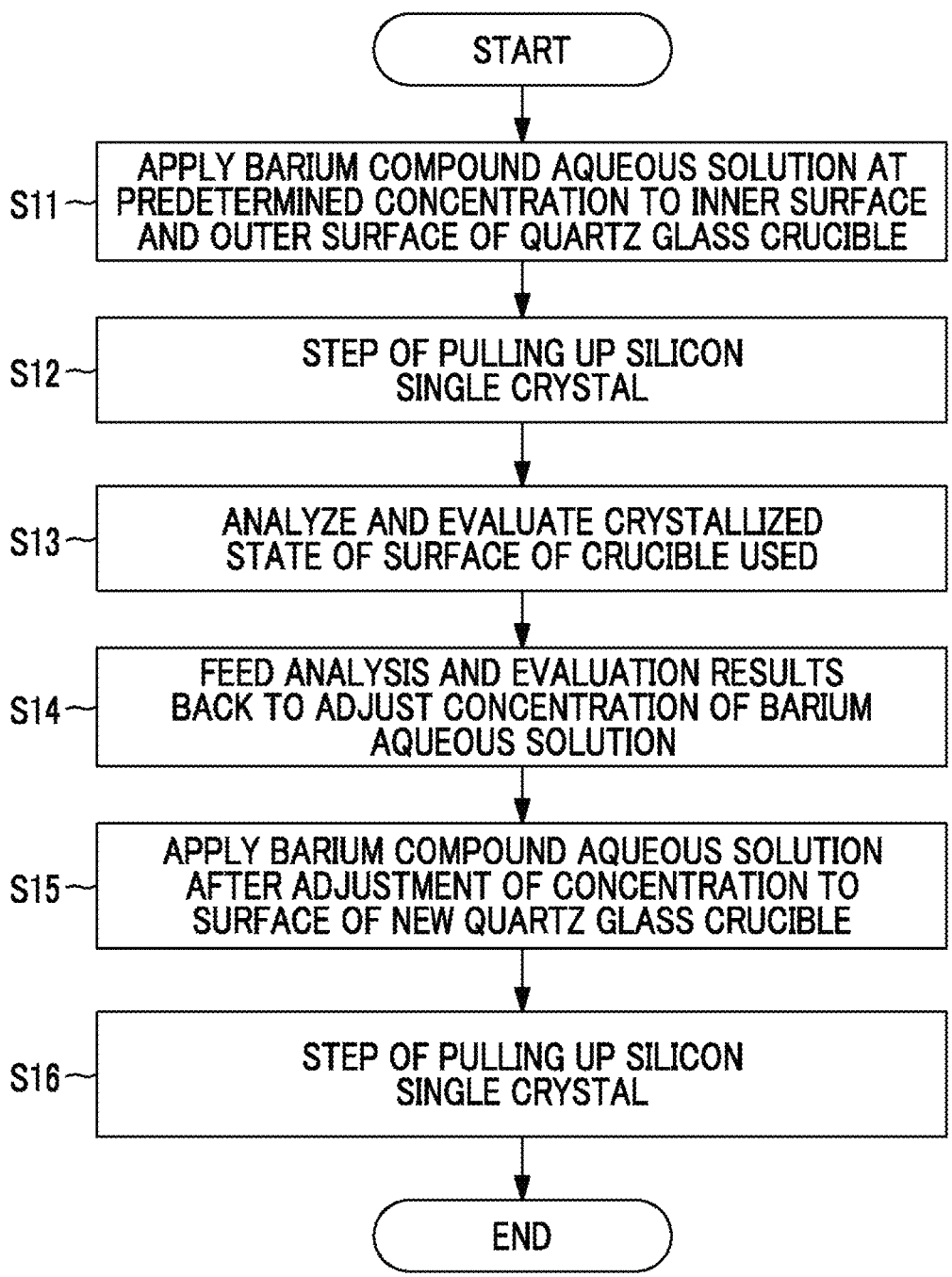
FIG. 6 is a flowchart for explaining a manufacturing method of a silicon single crystal using the quartz glass crucible 1 according to the embodiment.

FIG. 6 is a flowchart for explaining a manufacturing method of a silicon single crystal using the quartz glass crucible 1 according to the embodiment.

As illustrated in FIG. 6, in the manufacturing of a silicon single crystal according to the embodiment, a quartz glass crucible having the first and second crystallization-accelerator-containing coating films 13A and 13B formed therein is used. Therefore, a quartz glass crucible (crucible body 10) to which the crystallization accelerator is not applied (uncoated) is prepared, and barium compound coating solutions having appropriate concentrations are respectively applied to the inner surface and the outer surface thereof (step S11).

Next, a step of pulling up a silicon single crystal is performed using the quartz glass crucible 1 having the first and second crystallization-accelerator-containing coating films 13A and 13B formed therein (step S12). The pull-up step may be multi-pulling in which a plurality of silicon single crystals are pulled up from the same crucible, or may be single-pulling in which only a single silicon single crystal is pulled up.

Figure 9:
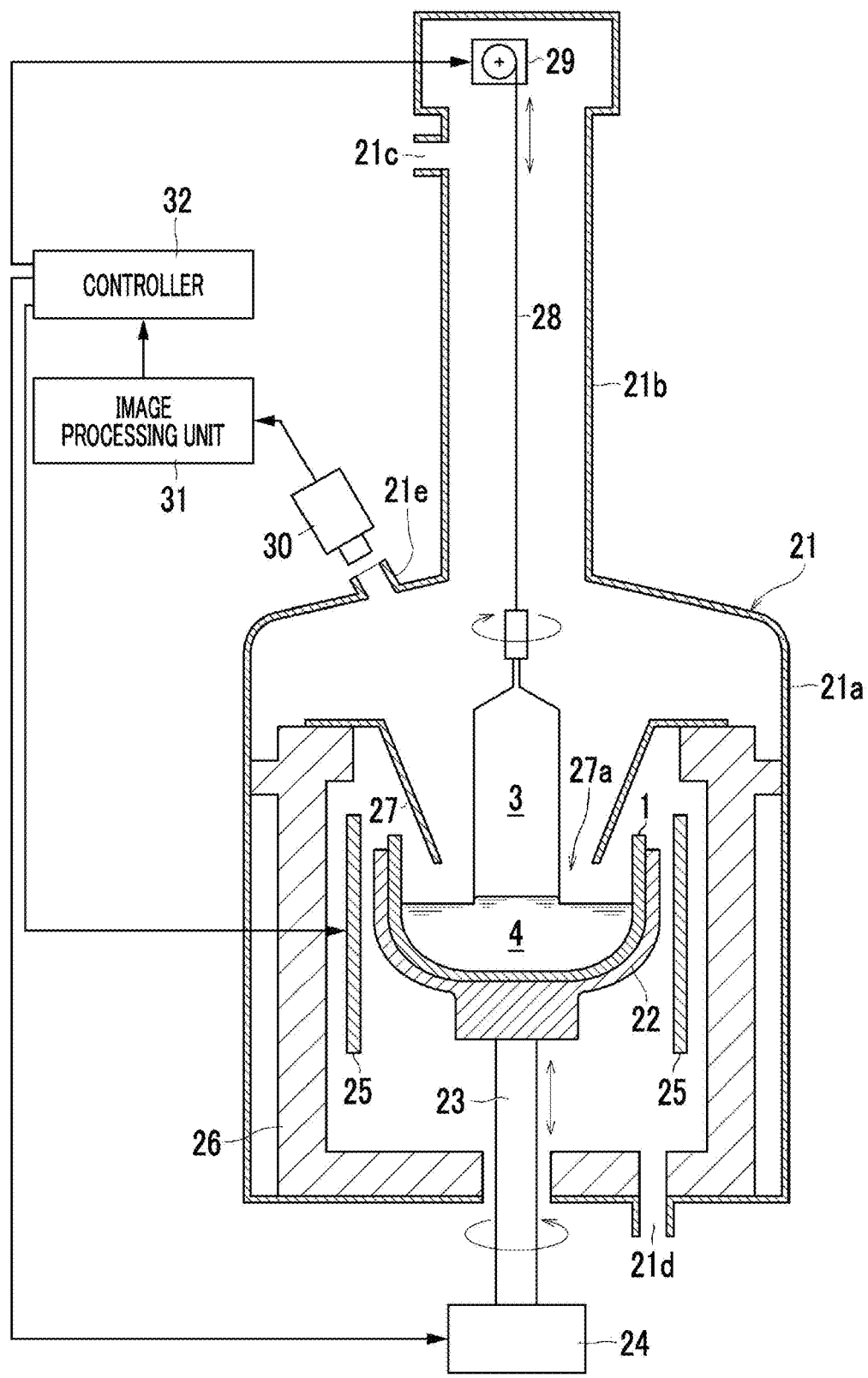
FIG. 9 is a schematic view for explaining a step of pulling up a silicon single crystal by the CZ method.

FIG. 9 is a schematic view for explaining the step of pulling up a silicon single crystal by the CZ method.

As illustrated in FIG. 9, a single crystal pull-up apparatus 20 is used in the step of pulling up a silicon single crystal by the CZ method. The single crystal pull-up apparatus 20 includes a water cooling type chamber 21, the quartz glass crucible 1 which holds a silicon melt 4 in the chamber 21, a carbon susceptor 22 which holds the quartz glass crucible 1, a rotary shaft 23 which supports the carbon susceptor 22, a shaft driving mechanism 24 which rotates and lifts/lowers the rotary shaft 23, a heater 25 disposed in the periphery of the carbon susceptor 22, a heat insulation material 26 disposed outside the heater 25 along the inner surface of the chamber 21, a heat-shield body 27 disposed above the quartz glass crucible 1, a crystal pull-up wire 28 disposed above the quartz glass crucible 1 coaxially with the rotary shaft 23, and a wire winding mechanism 29 disposed at the upper portion the chamber 21.

The chamber 21 is constituted of a main chamber 21a and an elongated cylindrical pull chamber 21b connected to an upper opening of the main chamber 21a. The quartz glass crucible 1, the carbon susceptor 22, the heater 25, and the heat-shield body 27 are provided in the main chamber 21a. A gas inlet port 21c for introducing inert gas (purge gas) such as argon gas or dopant gas into the chamber 21 is provided in the upper portion of the pull chamber 21b, and a gas exhaust port 21d for exhausting the atmosphere gas in the chamber 21 is provided at the lower portion of the main chamber 21a. In addition, a sight window 21e is provided at the upper portion of the main chamber 21a so as to allow a growing state of a silicon single crystal 3 to be observed through the sight window 21e.

The carbon susceptor 22 is used for maintaining the shape of the quartz glass crucible 1 which is softened by heating, and holds and surrounds the quartz glass crucible 1 by coming in close contact with the outer surface of the quartz glass crucible 1. The quartz glass crucible 1 and the carbon susceptor 22 constitute a double-structure quartz glass crucible that supports the silicon melt 4 in the chamber 21.

The carbon susceptor 22 is fixed to the upper end portion of the rotary shaft 23, and the lower end portion of the rotary shaft 23 passes through the bottom portion of the chamber 21 and is connected to the shaft driving mechanism 24 provided outside the chamber 21. The rotary shaft 23 and the shaft driving mechanism 24 constitute a rotary mechanism and a lifting/lowering mechanism of the quartz glass crucible 1 and the carbon susceptor 22.

The heater 25 is used for generating the silicon melt 4 by melting a silicon raw material filling the quartz glass crucible 1, and for maintaining the molten state of the silicon melt 4. The heater 25 is a carbon heater of a resistance heating type and is provided so as to surround the quartz glass crucible 1 in the carbon susceptor 22. Furthermore, the heat insulation material 26 is provided outside the heater 25 to surround the heater 25, whereby the heat retention in the chamber 21 can be enhanced.

The heat-shield body 27 is provided to form an appropriate hot zone in the vicinity of the crystal growth interface by suppressing temperature variations of the silicon melt 4 and to prevent the silicon single crystal 3 from being heated by radiant heat from the heater 25 and the quartz glass crucible 1. The heat-shield body 27 is a graphite member which covers the region above the silicon melt 4 excluding the pull-up path of the silicon single crystal 3, and for example, has an inverse truncated cone shape with an opening size increasing from the lower end to the upper end.

The diameter of an opening 27a of the lower end of the heat-shield body 27 is larger than the diameter of the silicon single crystal 3, whereby the pull-up path of the silicon single crystal 3 is secured. The diameter of the opening 27a of the heat-shield body 27 is smaller than the aperture of the quartz glass crucible 1, and the lower end portion of the heat-shield body 27 is positioned inside the quartz glass crucible 1. Therefore, the heat-shield body 27 does not interfere with the quartz glass crucible 1 even when the rim upper end of the quartz glass crucible 1 is lifted above the lower end of the heat-shield body 27.

While the amount of the melt in the quartz glass crucible 1 decreases as the silicon single crystal 3 grows, temperature variations in the silicon melt 4 are suppressed by lifting the quartz glass crucible 1 so as to cause the gap between the melt surface and the lower end of the heat-shield body 27, and the amount of dopants vaporized from the silicon melt 4 can be controlled by causing the flow rate of gas flowing in the vicinity of the melt surface to be constant. Therefore, it is possible to improve the stability of a crystal defect distribution, an oxygen concentration distribution, a resistivity distribution, and the like in a pull-up axis direction of the silicon single crystal 3.

Above the quartz glass crucible 1, the wire 28 as a pull-up axis of the silicon single crystal 3, and the wire winding mechanism 29 for winding the wire 28 are provided. The wire winding mechanism 29 has a function of rotating the silicon single crystal 3 together with the wire 28. The wire winding mechanism 29 is disposed at the upper portion of the pull chamber 21b, the wire 28 extends downward from the wire winding mechanism 29 through the pull chamber 21b, and the tip end portion of the wire 28 reaches the internal space of the main chamber 21a. FIG. 9 illustrates a state where the silicon single crystal 3 during growing is suspended by the wire 28. During pulling up the silicon single crystal 3, the silicon single crystal 3 is grown by gradually pulling up the wire 28 while rotating each of the quartz glass crucible 1 and the silicon single crystal 3.

A CCD camera 30 is provided outside the sight window 21e. During the process of pulling up a single crystal, the CCD camera 30 photographs the boundary between the silicon single crystal 3 and the silicon melt 4 viewed obliquely from above through the opening 27a of the heat-shield body 27 from the sight window 21e. The image taken by the CCD camera 30 is processed by an image processing unit 31, and the processing result is used by a controller 32 to control pull-up conditions.

Although the inner surface of the quartz glass crucible 1 is eroded by the reaction with the silicon melt 4 during the step of pulling up a silicon single crystal, since crystallization of the inner surface and the outer surface proceeds due to the action of the crystallization accelerator applied to the inner surface and the outer surface of the crucible, the crystal layer of the inner surface does not disappear, and the thickness of the crystal layer can be secured to some extent, thereby maintaining the strength of the crucible and suppressing deformation thereof. Therefore, it is possible to prevent the crucible from being deformed and coming into contact with the members in the furnace such as the heat-shield body 27 and to prevent variations in the liquid surface position of the silicon melt 4 due to a change in the internal volume of the crucible.

When a crystal piece delaminated from the inner surface of the quartz glass crucible 1 rides on the convection of the silicon melt 4 and reaches a solid/liquid interface, the crystal piece is incorporated into the silicon single crystal 3, so that there is concern that dislocation may occur. However, according to the embodiment, delamination of the crystal piece from the inner surface of the crucible can be prevented, whereby dislocation of a single crystal can be prevented.

Next, the surface of the used crucible after the end of the pull-up step is analyzed by the X-ray diffraction method, and the crystallized state of the crystal layer is evaluated (step S13). As described above, a peak intensity ratio A/B of more than 7 can be evaluated as a crystal layer in a random orientation, a peak intensity ratio A/B of 0.4 or more and 7 or less can be evaluated as a crystal layer in a dome-like orientation, and a peak intensity ratio A/B of less than 0.4 can be evaluated as a crystal layer in a columnar orientation.

Next, the analysis and evaluation results are fed back to adjust the concentration of the barium compound coating solution (step S14). For example, in a case where the crystallized state of the outer crystal layer 14B is in a columnar orientation and the crystal layer becomes excessively thick, the barium concentration in the barium compound coating solution to be used may be adjusted to be decreased. In addition, in a case where the crystallized state of the inner crystal layer 14A is in a dome-like orientation but a columnar orientation is desired, the barium concentration in the barium compound coating solution to be used may be adjusted to be increased.

The analysis and evaluation results may include the degree of orientation of crystals (evaluation results by X-ray diffraction: peak ratio), the thickness of a crystal layer, the thickness gradient, the thickness distribution, the grain size of crystals, the presence or absence of foaming and delamination of the crystal layer, and the like. In addition, adjustment items may include the concentration (of each part), the thickness of the coating film (of each part), formulation of the thickener, the particle size of barium carbonate, and the like. As a method of adjusting the items, since the thermal load varies with the part of the crucible depending on the crystal pull-up conditions, pulling up is performed by applying barium at a uniform barium concentration regardless of the part of the crucible initially, the thickness distribution and the like of the crystal layer of the used crucible are analyzed, and the above-mentioned items may be adjusted for each part so that the crystal layer becomes uniform.

Thereafter, a new uncoated quartz glass crucible is prepared, the barium compound coating solution of which the concentration is adjusted is applied to the surface thereof (step S15), and the step of pulling up a silicon single crystal is newly performed using the quartz glass crucible (step S16). In the pull-up step performed as described above, the crystal layer of the surface of the quartz glass crucible 1 is in the optimal crystallized state for each part, so that a crystal layer which is uniform in a plane can be formed without delamination of crystal grains at the inner surface 10a of the crucible body 10 and columnar crystals can be continuously grown, which in turn always maintains the strength. In addition, on the outer surface 10b of the crucible body 10, inconveniences such as forming and delamination can be prevented while maintaining a certain strength.

As described above, in the quartz glass crucible 1 according to the embodiment, since the inner crystal layer 14A formed of the dome-shaped/columnar crystal layer or the dome-shaped crystal layer is formed on the inner surface 10a of the crucible body 10 by heating in the pull-up step, the inner crystal layer 14A can have a sufficient thickness. Therefore, the deformation thereof can be prevented by increasing the strength of the crucible. In addition, it is possible to prevent the inner crystal layer 14A from completely disappearing due to the erosion of the inner surface of the crucible.

In a case where the inner crystal layer 14A is the dome-shaped/columnar crystal layer, even if the dome-shaped crystal layer is eroded, since the orientation direction of the columnar crystal layer is the thickness direction of the crucible wall, delamination of columnar crystal grains can be prevented. In addition, by causing the inner crystal layer 14A to undergo the columnar orientation, the crystal growth can be concentrated in the thickness direction of the crucible wall, so that the crystal growth rate can be increased.

In addition, in the quartz glass crucible 1 according to the embodiment, since the outer crystal layer 14B formed of the dome-shaped crystal layer is formed on the outer surface 10b of the crucible body 10 by heating in the pull-up step, the outer crystal layer 14B can have a sufficient thickness. Therefore, the deformation thereof can be prevented by increasing the strength of the crucible. In addition, by forming the dome-shaped crystal layer in the outer surface 10b of the crucible body 10, the crystal grain boundaries can be densified, thereby preventing cracks from reaching the inside of the crucible due to impacts and the like from the outer surface of the crucible.

In addition, by causing the outer crystal layer 14B to have the dome-shaped crystal layer instead of the columnar crystal layer, crystal growth is not sustained, so that the outer crystal layer 14B does not become excessively thick. Therefore, it is possible to prevent delamination of the crystal layer due to expansion of bubbles at the interface between a thick crystal layer and quartz glass, and furthermore, it is possible to prevent the generation of cracks propagating from the bubbles along the columnar crystal grain boundaries.

Also, according to the embodiment, the crystallized states of the crystal layers of the surfaces (the inner surface and the outer surface) of the crucible can be easily evaluated by the X-ray diffraction method. Therefore, the coating conditions of the crystallization accelerator can be selected based on the evaluation results, and the quartz glass crucible 1 having a crystallized state matching the pull-up conditions of the silicon single crystal and the part of the crucible can be manufactured.

Figure 10:
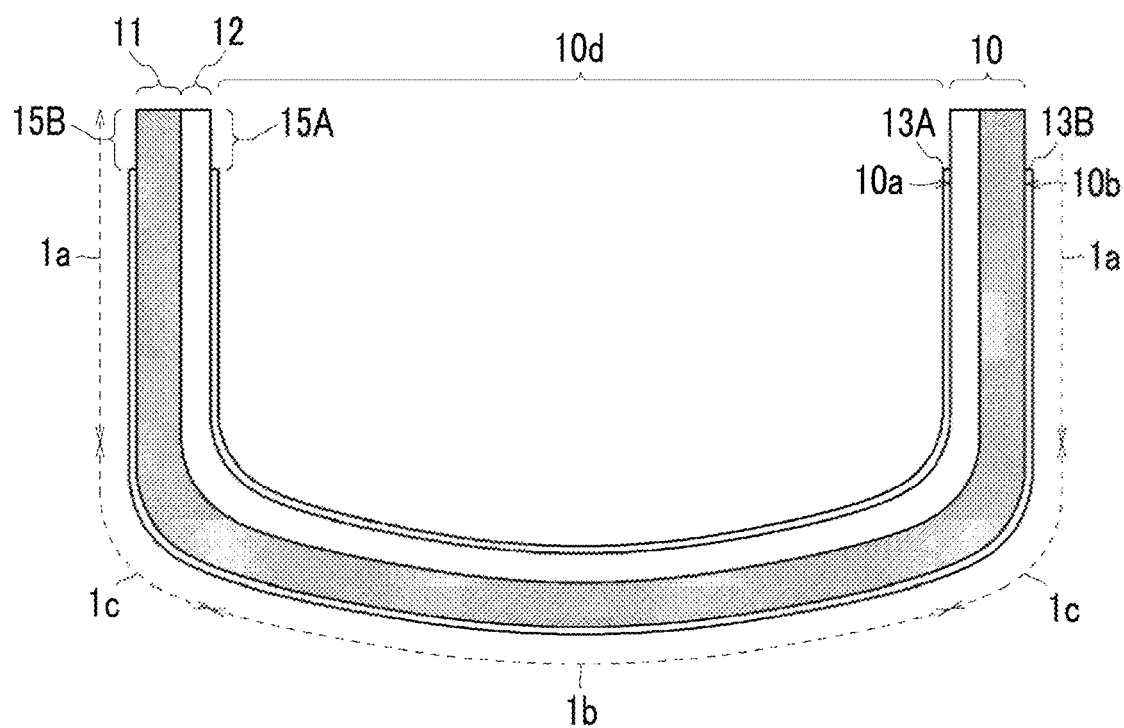
FIG. 10 is a schematic cross-sectional view illustrating the structure of a quartz glass crucible according to a second embodiment of the present invention.

FIG. 10 is a schematic cross-sectional view illustrating the structure of a quartz glass crucible according to a second embodiment of the present invention.

As illustrated in FIG. 10, a quartz glass crucible 2 according to the embodiment is featured in that the crystallization-accelerator-containing coating films 13A and 13B respectively formed on the inner surface 10a and the outer surface 10b of the crucible body 10 are not formed to reach the rim upper end of the crucible body 10. That is, a band-like region having a predetermined width extending downward from the rim upper end of the inner surface 10a of the crucible body 10 is a crystallization accelerator uncoated region 15A (hereinafter, simply referred to as "uncoated region 15A") in which the crystallization-accelerator-containing coating film 13B is not formed, and a band-like region having a predetermined width extending downward from the rim upper end of the outer surface 10b is a crystallization accelerator uncoated region 15B (hereinafter, simply referred to as "uncoated region 15B") in which the crystallization-accelerator-containing coating film 13A is not formed.

In the case where the crystallization-accelerator-containing coating films 13A and 13B are respectively formed to reach the rim upper end of the inner surface 10a or the outer surface 10b of the crucible body 10, the rim upper end portion (the inner surface 10a and the outer surface 10b in the vicinity of the rim upper end and the rim upper end surface) is crystallized, and there is concern that particles of small crystal pieces generated from the crystallized region may be incorporated into the silicon melt, resulting in a reduction in the yield of the silicon single crystal. However, in a case where the uncoated regions 15A and 15B are provided, crystallization of the rim upper end portion can be suppressed, and a reduction in the yield of the silicon single crystal due to the generation of particles of small crystal pieces at the rim upper end portion can be prevented.

It is preferable that the uncoated regions 15A and 15B extend downward from the rim upper end in a range of 2 mm or more and 40 mm or less. This is because, in a case where the width of the uncoated regions 15A and 15B is smaller than 2 mm, the effect of providing the uncoated regions 15A and 15B is insufficient. In addition, in a case where the width of the uncoated regions 15A and 15B is greater than 40 mm, there is a possibility that the boundary position between the crystallization-accelerator-containing coating film and the uncoated region may be present in the silicon melt, and when the boundary between the crystal layer and the glass layer is immersed in the silicon melt, there is a higher possibility that cracks may be generated by stress concentration on the boundary region and particles of small crystal pieces may be generated.

As illustrated in FIG. 9, although the quartz glass crucible 1 during the crystal pull-up step is accommodated in the carbon susceptor 22, the rim upper end portion of the quartz glass crucible 1 protrudes upward from the upper end of the carbon susceptor 22 and thus is always in a self-sustaining state without being supported by the carbon susceptor 22. It is preferable that the uncoated regions 15A and 15B are provided in a region protruding upward from the upper end of the carbon susceptor 22. As described above, by causing the rim upper end portion of the quartz glass crucible 1 which is not in contact with the carbon susceptor 22 to be the uncoated region, the yield of the silicon single crystal can be improved, and deformation of the crucible due to foaming and delamination of the crystal layer can be prevented.

It is preferable that the range of the width of the uncoated regions 15A and 15B is 0.02 times to 0.1 times the length of the straight body portion 1a of the crucible. This is because, in a case where the width of the uncoated regions 15A and 15B is smaller than 0.02 times the length of the straight body portion 1a of the crucible, the effect of providing the uncoated regions 15A and 15B is insufficient. In addition, in a case where the width of the uncoated regions 15A and 15B is larger than 0.1 times the length of the straight body portion 1a of the crucible, the uncoated region is formed to reach the region supported by the carbon susceptor 22 and there is concern of deformation of the crucible due to foaming and delamination of the crystal layer or deterioration of the yield of the silicon single crystal.

Figure 11:
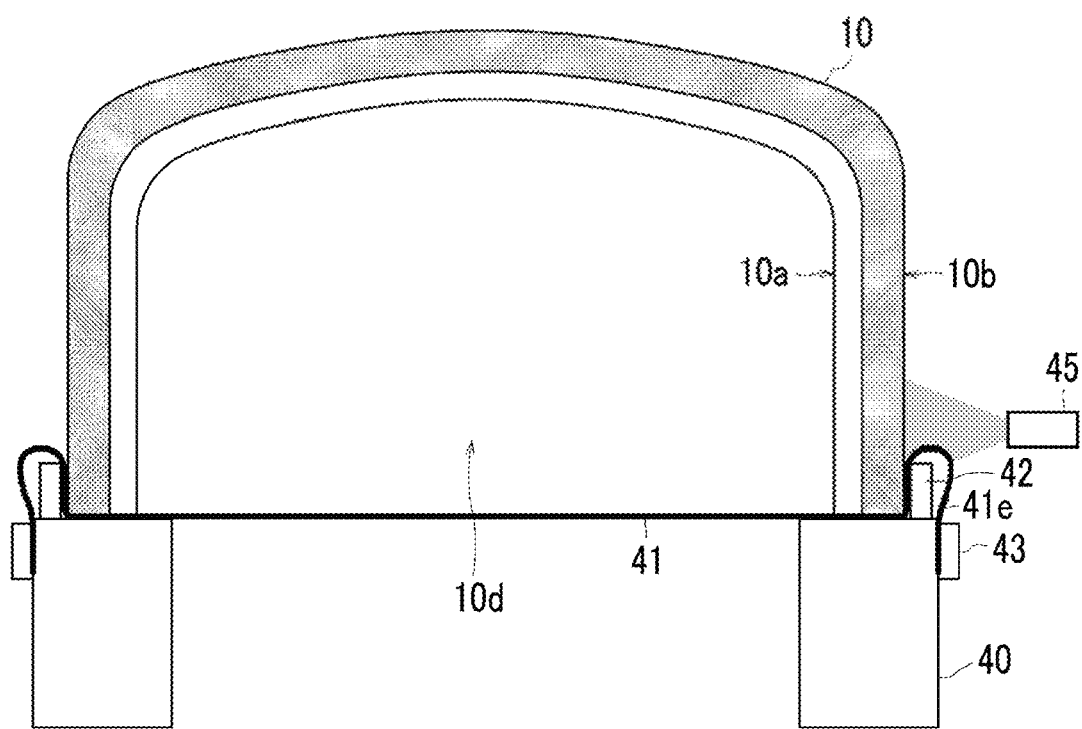
FIG. 11 is a schematic view for explaining a method of forming a crystallization-accelerator-containing coating film 13B on the outer surface of the quartz glass crucible 2 illustrated in FIG. 10.

FIG. 11 is a schematic view for explaining an example of a method of forming the uncoated region 15B together with the crystallization-accelerator-containing coating film 13B on the outer surface of the quartz glass crucible 2 illustrated in FIG. 10.

As illustrated in FIG. 11, in a case of forming the crystallization-accelerator-containing coating film 13B on the outer surface 10b of the crucible body 10, the crystallization-accelerator-containing coating film 13B can be formed by a spraying method. Here, in a case where the uncoated region 15B is provided at the rim upper end portion, first, a polyethylene sheet (PE sheet) 41 is put on an opening 10d of the crucible body 10 to cover the opening 10d, the PE sheet 41 at the mouth of the opening 10d is fixed by a polypropylene band (PP band) 42 to seal the opening 10d.

Thereafter, as illustrated, the opening 10d of the crucible body 10 is placed on a rotary stage 40 in a state of facing downward, and in a state in which an end portion 41e of the PE sheet 41 which extends outward from the fixing position of the PP band 42, the end portion 41e of the PE sheet 41 is fixed to the outer circumferential surface of the rotary stage 40 by a rubber band 43.

After masking the region having a predetermined width (2 to 40 mm) extending downward from the rim upper end of the outer surface 10b of the crucible body 10 with the PE sheet 41 and the PP band 42, a crystallization-accelerator-containing coating solution is applied to the entire outer surface 10b of the crucible body 10 using a spray 45, whereby the crystallization-accelerator-containing coating film 13B can be formed and the uncoated region 15B can be formed in the vicinity of the rim upper end of the outer surface 10b of the crucible body 10.

The above description is an example of the method of forming the uncoated region 15B together with the crystallization-accelerator-containing coating film 13B on the outer surface of the quartz glass crucible 2, and the same can also be applied to a case of forming the uncoated region 15A together with the crystallization-accelerator-containing coating film 13A on the inner surface of the quartz glass crucible 2. That is, the crystallization accelerator coating solution may be applied by the spraying method in a state in which a region having a predetermined width extending downward from the rim upper end in the inner surface 10a of the crucible body 10 is masked.

As described above, since the quartz glass crucible 2 according to the embodiment is provided with the crystallization accelerator uncoated regions 15A and 15B on the inner surface 10a and the outer surface 10b of the rim upper end portion of the crucible body 10, in addition to the effect of the invention by the first embodiment, it is possible to prevent a decrease in the yield of the silicon single crystal due to the generation of particles of small crystal pieces at the rim upper end portion.

While the preferred embodiments of the present invention have been explained above, the present invention is not limited to the embodiments and may be variously modified without departing from the scope of the present invention. Accordingly, all such modifications are included in the present invention.

For example, the crystallization-accelerator-containing coating films 13A and 13B do not necessarily have to be formed on both the inner surface 10a and the outer surface 10b of the crucible body 10, but may be formed only on the inner surface 10a of the crucible body 10 or only on the outer surface 10b. However, since the inner surface 10a of the crucible is in contact with the silicon melt and has a large erosion amount, the effect of crystallization thereof is larger than that of the outer surface 10b of the crucible, and it is more important to form a crystal layer on the inner surface than on the outer surface of the crucible.

In addition, in the embodiment, the inner crystal layer 14A may have a single-layer structure of a dome-shaped crystal layer, and the outer crystal layer 14B may have a random crystal layer or a dome-shaped crystal layer.

In addition, in the embodiment, the case where the crystallized state of the crucible used in the proceeding crystal pull-up step is fed back to the crucible used in the subsequent crystal pull-up step is exemplified. However, the present invention is not limited to such a case. Therefore, for example, the conditions of a simulation test with a quartz piece may be determined based on predetermined crystal pull-up conditions, and evaluation of the quartz piece may be performed under these conditions and coating conditions may be determined based on the evaluation results. That is, the crystallized state of the crystal layer formed on the surface layer of the quartz piece by heating during the simulation test modeled on the crystal pull-up step may be analyzed, and based on the analysis results, the concentration of the crystallization accelerator in the crystallization accelerator coating solution applied to the inner surface of the quartz glass crucible used in an actual silicon single crystal pull-up step may be adjusted.

In addition, as a method of applying the crystallization accelerator coating solution to the surface of the crucible, in addition to a method using a brush, a spray type, a dipping type, curtain coating, or the like may also be adopted.

EXAMPLE

The effect of the concentration of the barium compound coating solution on the crystallized state of the crystal layer was evaluated. In this evaluation test, an aqueous solution having a reference concentration in which 50 g/L of polyvinyl alcohol (thickener) was dissolved in barium acetate (0.02 M of metal ions) was first prepared, and six types of coating solutions in which the concentration of barium acetate in the aqueous solution was adjusted to 0.01 times, 0.031 times, 0.063 times, 0.125 times, 0.5 times, and 2 times were prepared. Next, 12 quartz glass plates were prepared, and a set of two plates was immersed into each of the six types of coating solutions after adjusting the concentration so as to be coated.

Next, the barium concentration on the surface of the quartz glass plate was obtained. In order to calculate the barium concentration, the number of moles of barium was obtained from the weight of the barium acetate aqueous solution which was reduced by immersing the quartz glass plate, the number of atoms of barium was calculated from the number of moles of barium and the Avogadro constant, and the barium concentration was obtained from the number of atoms thereof and the surface area of the quartz glass plate to which the barium acetate aqueous solution was adhered.

Next, the 12 quartz glass plates were heated in a test furnace at 1450° C. The heating time was set to 30 minutes for one of the two quartz glass plates to which the same aqueous solution was applied, and was set to 90 minutes for the other.

Next, the crystallized state of the surface-layer portion of the 12 quartz glass plates after the heat treatment was observed by a SEM (Scanning Electron Microscope). Furthermore, among the 12 quartz glass plates, the surfaces of the quartz glass plates subjected to the heat treatment with the coating solutions at a concentration ratio of 0.031 times, 0.125 times, 0.5 times, and 2 times for 90 minutes was analyzed by the X-ray diffraction method, and the peak intensity ratio A/B was obtained. The evaluation of the quartz glass plates by the X-ray diffraction method was performed using an X-ray diffractometer RINT 2500 manufactured by Rigaku Corporation with target: Cu ($\lambda=1.5418$ nm), scanning axis: $2\theta$, measurement method: continuous, $2\theta$ angle scanning range: 10° to 70°, light-receiving slit: 0.15 mm, divergence slit: 1°, scattering slit: 1°, sampling width: 0.02°, and scanning speed: 10°/min. The depth (detection depth) from the surface being evaluated by X-rays varied depending on the incident angle of X-rays, and was set to several nanometers to several tens micrometers.

Table 1 is a list of evaluation test results of the quartz glass plates.

TABLE 1

| Quartz glass plate sample | Coating solution concentration ratio | Surface concentration (atoms/cm$^2$) | Crystal orientation | Crystal growth rate 30 → 90 min | X-ray diffraction peak intensity ratio |
|---|---|---|---|---|---|
| A1 | ×0.01 | 7.8E14 | Random | | |
| A2 | ×0.031 | 2.4E15 | Random | 0 μm/h | 8 |
| A3 | ×0.063 | 4.9E15 | Dome-like | | |
| A4 | ×0.125 | 9.7E15 | Dome-like | 150 μm/h | 0.64 |
| A5 | ×0.5 | 3.9E16 | Columnar | 450 μm/h | 0.16 |
| A6 | ×2 | 1.6E17 | Columnar | 450 μm/h | |

As shown in Table 1, the barium concentration on the surface (surface barium concentration) of a quartz glass plate sample A1 to which the barium acetate aqueous solution at a concentration ratio of 0.01 times to the reference concentration was applied was $7.8 \times 10^{14}$ atoms/cm$^2$, and the barium concentration on the surface of a quartz glass plate sample A2 to which the barium acetate aqueous solution at a concentration ratio of 0.031 times was applied was $2.4 \times 10^{15}$ atoms/cm$^2$, so that both were crystal growths of cristobalite in a random orientation.

The barium concentration on the surface of a quartz glass plate sample A3 to which the barium acetate aqueous solution at a concentration ratio of 0.063 times was applied was $4.9\times10^{15}$ atoms/cm$^2$, and the barium concentration on the surface of a quartz glass plate sample A4 to which the barium acetate aqueous solution at a concentration ratio of 0.125 times was applied was $9.7\times10^{15}$ atoms/cm$^2$, so that both were crystal growths of cristobalite in a dome-like orientation.

In addition, the barium concentration on the surface of a quartz glass plate sample A5 to which the barium acetate aqueous solution at a concentration ratio of 0.5 times was applied was $3.9\times10^{16}$ atoms/cm$^2$, and the barium concentration on the surface of a quartz glass plate sample A6 to which the barium acetate aqueous solution at a concentration ratio of 2 times was applied was $1.6\times10^{17}$ atoms/cm$^2$, so that both were crystal growths of cristobalite in a columnar orientation.

FIG. 7(a) is an image showing the observation results of the crystal layers by SEM. In addition, FIG. 7(b) is a graph showing the relationship between the heating time of the quartz glass plate and the thickness of the crystal layer formed on the surface-layer portion of the quartz glass plate, in which the horizontal axis represents the heating time and the vertical axis represents the thickness of the crystal layer.

As shown in FIG. 7(a), in a case where the barium acetate aqueous solution diluted to 0.031 times the reference concentration was applied to the quartz glass plate, the thickness of the crystal layer after 30 minutes from the start of the heating was about 200 μm, and was about 200 μm even after 90 minutes, which means that crystal layer hardly grew after 30 minutes from the start of the heating. That is, the crystal growth rate after 30 minutes from the start of the heating was approximately 0 μm/h. In addition, as shown in FIG. 7(b), the crystal layer from the SEM image was crystal growth of cristobalite in a random orientation. Furthermore, the crystal structure of the crystal layer was analyzed by the X-ray diffraction method and had a peak pattern as shown in FIG. 4(a), and the peak intensity ratio A/B mentioned above was 8.

In a case where the barium acetate aqueous solution diluted to 0.125 times the reference concentration was applied to the quartz glass plate, the thickness of the crystal layer after 30 minutes was about 250 μm, and was about 400 μm after 90 minutes, which means that the crystal growth rate after 30 minutes from the start of the heating was approximately 150 μm/h. In addition, as shown in FIG. 7 (a), the crystal layer from the SEM image was crystal growth of cristobalite in a dome-like orientation. Both the width and the length of dome-shaped crystal grains were about 5 to 30 μm. Furthermore, the crystal structure of the crystal layer was analyzed by the X-ray diffraction method and had a peak pattern as shown in FIG. 4(b), and the peak intensity ratio A/B mentioned above was 0.64.

In a case where the barium acetate aqueous solution diluted to 0.5 times the reference concentration was applied to the quartz glass plate, the thickness of the crystal layer after 30 minutes was about 190 μm, but was about 600 μm after 90 minutes, which means that the crystal growth rate after 30 minutes from the start of the heating was approximately 450 μm/h. In addition, as shown in FIG. 7(a), the crystal layer from the SEM image was changed to crystal growth in a columnar orientation from a dome-like orientation. The width of columnar crystal grains was about 10 to 50 μm, and the length thereof was 50 μm or more, and mostly about 50 to 100 μm. Furthermore, the crystal structure of the crystal layer was analyzed by the X-ray diffraction method and had a peak pattern as shown in FIG. 4(c), and the peak intensity ratio A/B mentioned above was 0.16.

In a case where the barium acetate aqueous solution adjusted to twice the reference concentration was applied to the quartz glass plate, the same results were obtained as when the barium acetate aqueous solution adjusted to 0.5 times the reference concentration was used. In addition, as shown in FIG. 7(a), it was found that although the crystal layer from the SEM image was changed to the crystal growth in the columnar orientation from the dome-like orientation, the crystal growth period of the dome-like orientation was very short, and the crystal layer was changed from the dome-like orientation to the columnar orientation in an early stage.

From the above results, it was found that the crystallized state of the crystal layer was changed in order of the random orientation, the dome-like orientation, and the columnar orientation by increasing the concentration of the barium acetate aqueous solution, and the crystal layer was reliably changed to growth in the dome-like orientation to growth in the columnar orientation if the concentration is four times or more the concentration during the growth in the dome orientation. Therefore, it can be seen that when the crystal layer is in the columnar orientation, the barium concentration on the surface is $3.9\times10^{16}$ atoms/cm$^2$ or more. It should be noted that the barium concentration on the surface can also be obtained by analysis with fluorescent X-rays or the like.

Next, an evaluation test was conducted on the crystallized state and deformation of the surface of the crucible when the quartz glass crucible to which the coating solution containing barium was applied was used in an actual crystal pull-up step. In the crystal pull-up step, a silicon single crystal ingot having a diameter of about 300 mm was grown using a 32-inch quartz glass crucible. As the coating solution applied to the quartz glass crucible, a barium carbonate coating solution was used. As the barium carbonate coating solution, a solution containing 0.0012 g/mL of barium carbonate and 0.0008 g/mL of a carboxyvinyl polymer, in which the ratio between ethanol and pure water was adjusted, was used. Application to the surface of the crucible was performed with a brush.

In this evaluation test, three types of crucible samples were prepared. Sample #1 was obtained by applying the coating solution once to the outer surface of the crucible, sample #2 was obtained by applying the coating solution six times to the inner surface of the crucible, and sample #3 was obtained by applying the coating solution five times to the inner surface of the crucible. After the application, water evaporated in about 10 minutes, and ethanol evaporated in about 30 minutes, so that a hard film was formed by a thickener. After the application, the barium concentration on the surface of the crucible was obtained from the amount of the coating solution used.

Thereafter, silicon single crystal ingots were pulled up using the samples #1 to #3 of the quartz glass crucible by the CZ method. After the pull-up step ends, the shapes of the used crucible samples #1 to #3 were visually checked, and no deformation was observed. The crystallized state of the crucible was evaluated from SEM images of the sections of the used crucible samples #1 to #3, and the crystal structure of the crystal layer was further analyzed by the X-ray diffraction method.

Table 2 is a table showing the evaluation test results of the quartz glass crucibles.

TABLE 2

| Crucible sample | Coating conditions | Surface concentration (atoms/cm$^2$) | Crystal orientation | Crystal layer thickness | X-ray diffraction peak intensity ratio | Crucible deformation |
|---|---|---|---|---|---|---|
| #1 | Outer surface: once | 1.1E16 | Dome-like | 360 μm | 1.7 | Absent |
| #2 | Inner surface: six times | 6.6E16 | Columnar | 380 μm | 0.14 | Absent |
| #3 | Inner surface: five times | 5.5E16 | Columnar | 350 μm | 0.23 | Absent |

Figure 8:
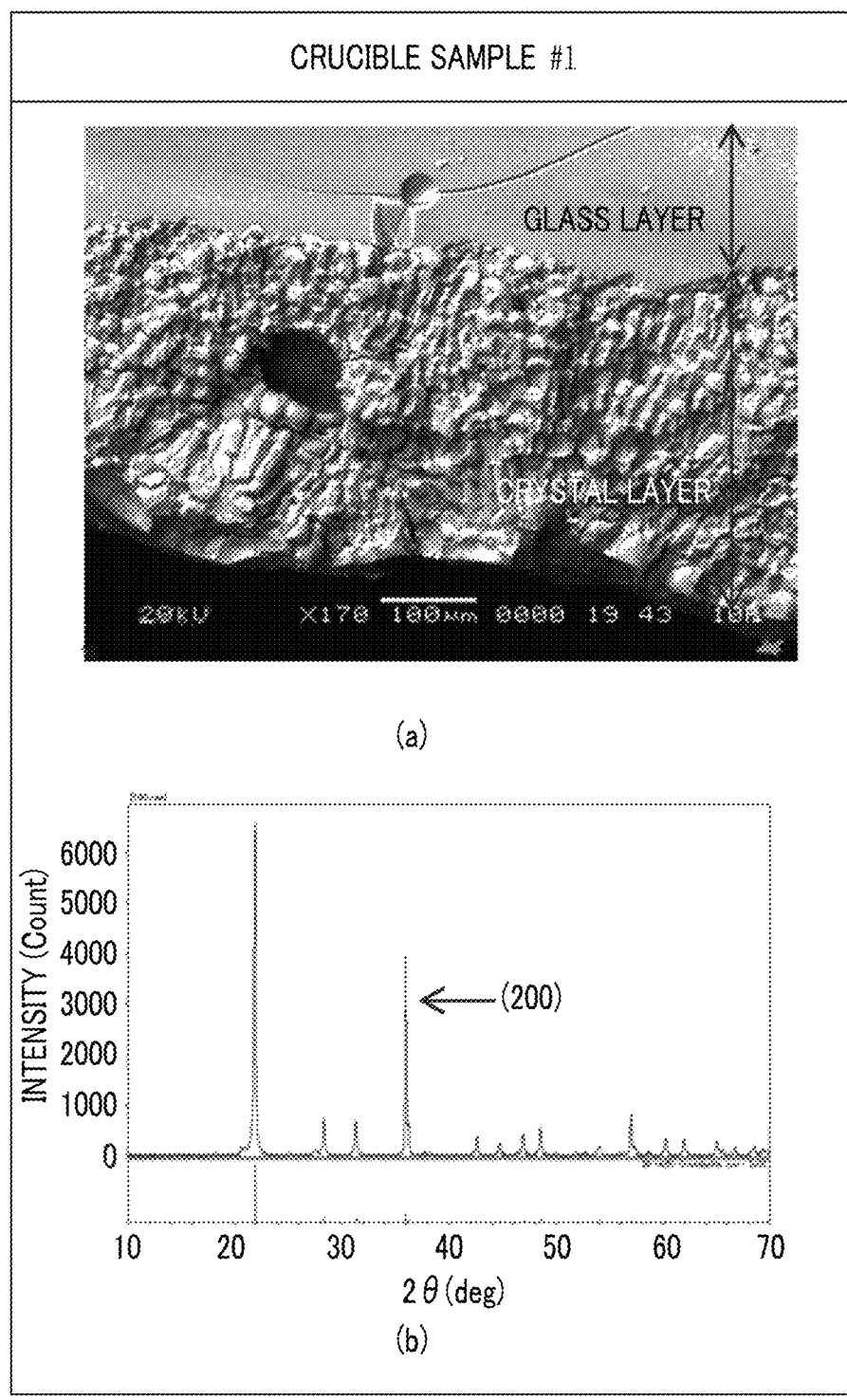
FIG. 8 shows evaluation results of crystallized states and deformation when a quartz glass crucible to which a coating solution containing barium is applied is used in an actual crystal pull-up step, and shows an SEM images and an X-ray diffraction spectrum graph of the crystal layer of each of crucible samples #1 to #3.
Figure 8:
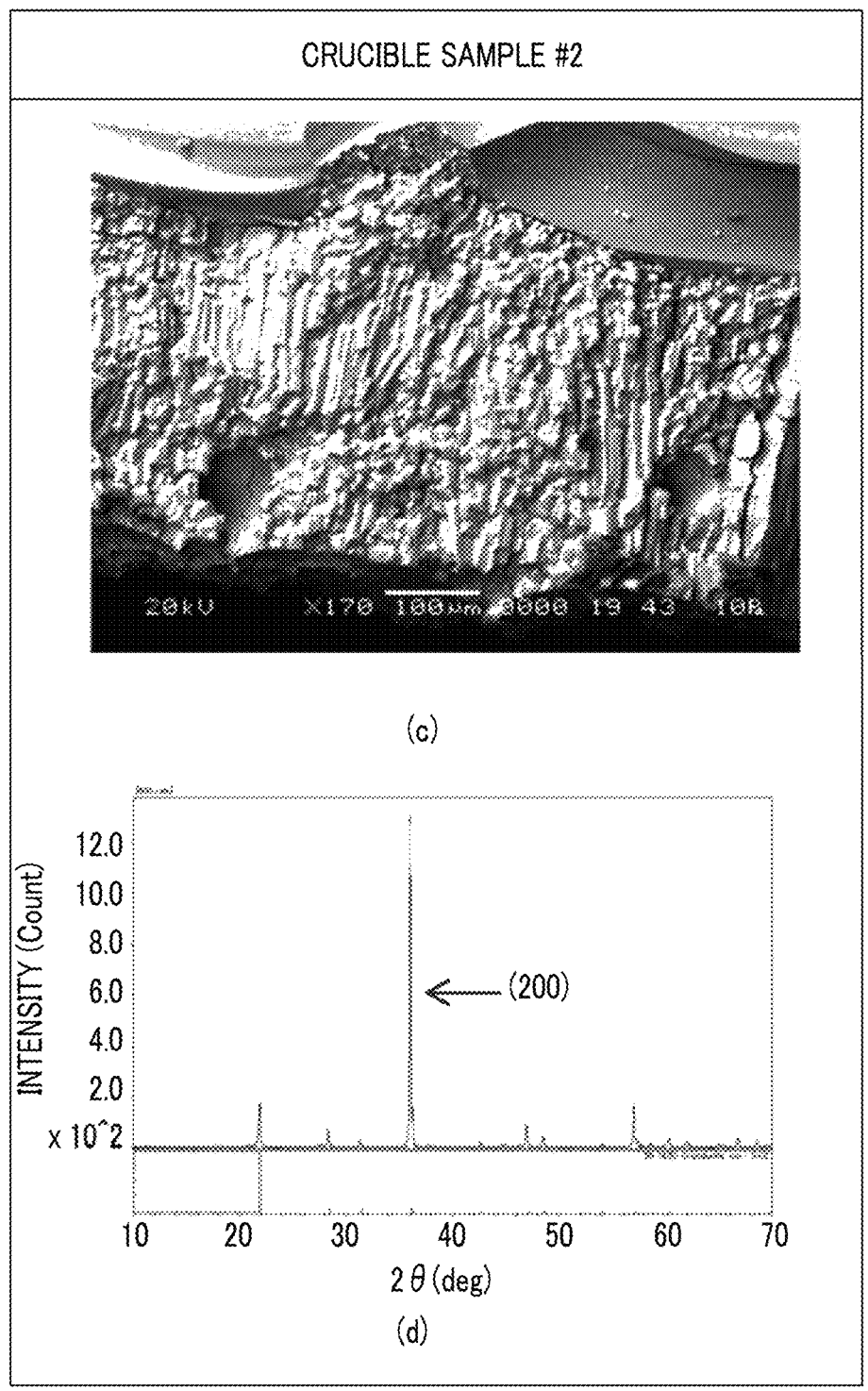
Figure 8:
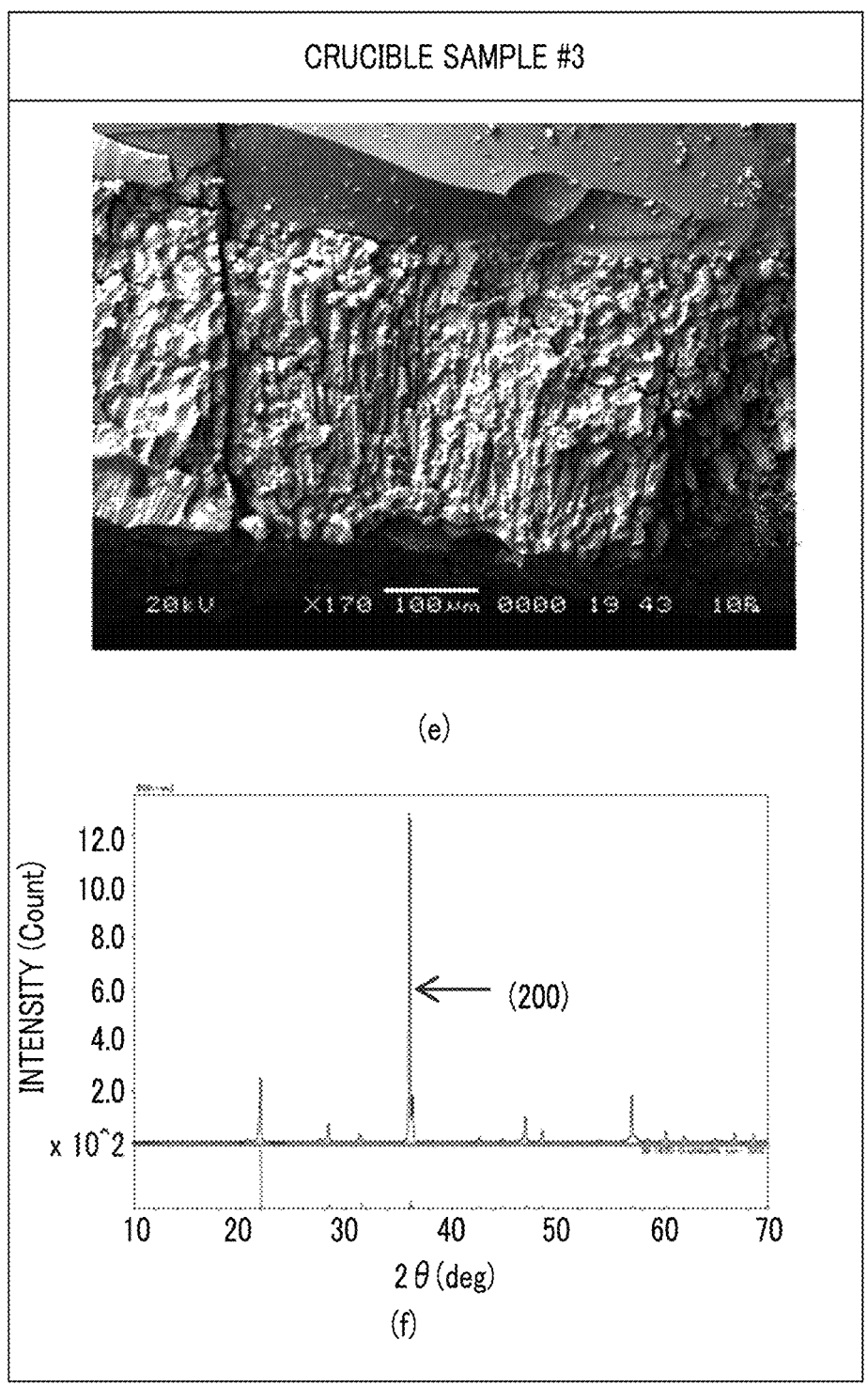

FIG. 8 is an SEM image and an X-ray diffraction spectrum graph of the crystal layer of each of the crucible samples #1 to #3.

The barium concentration on the outer surface of the sample #1 of the quartz glass crucible in which the coating solution was applied once to the outer surface of the crucible was $1.1 \times 10^{16}$ atoms/cm$^2$, and crystal growth of cristobalite in a dome-like orientation was confirmed from the SEM image shown in (a). In addition, the thickness of the outer crystal layer was about 360 μm. Furthermore, the X-ray diffraction spectrum of the outer crystal layer had a peak pattern in which the peak intensity B (the right peak at 2θ of 33° to 40°) was lower than the peak intensity A (the left peak at 2θ of 20° to 25°) as shown in (b), and the peak intensity ratio A/B mentioned above was 1.7.

In addition, the barium concentration on the inner surface of the crucible sample #2 in which the coating solution was applied six times to the inner surface of the crucible was $6.6 \times 10^{16}$ atoms/cm$^2$, and crystal growth of cristobalite in a columnar orientation was confirmed from the SEM image shown in (c). In addition, the thickness of the inner crystal layer was about 380 μm. Furthermore, the X-ray diffraction spectrum of the inner crystal layer had a peak pattern in which the peak intensity B was higher than the peak intensity A as shown in (d), and the peak intensity ratio A/B mentioned above was 0.14.

In addition, the barium concentration on the inner surface of the crucible sample #3 in which the coating solution was applied five times to the inner surface of the crucible was $5.5 \times 10^{16}$ atoms/cm$^2$, and crystal growth of cristobalite in a columnar orientation was confirmed from the SEM image shown in (e). In addition, the thickness of the inner crystal layer was about 350 μm. Furthermore, the X-ray diffraction spectrum of the inner crystal layer had a peak pattern in which the peak intensity B was higher than the peak intensity A as shown in (f), and the peak intensity ratio A/B mentioned above was 0.23.

DESCRIPTION OF THE SYMBOLS 1, 2 quartz glass crucible
1a straight body portion of quartz glass crucible
1b bottom portion of quartz glass crucible
1c corner portion of quartz glass crucible
3 silicon single crystal
4 silicon melt
10 crucible body
10a inner surface of crucible body
10b outer surface of crucible body
10d opening of crucible body
11 opaque layer
12 transparent layer
13A first crystallization-accelerator-containing coating film
13B second crystallization-accelerator-containing coating film
14A inner crystal layer
14B outer crystal layer
15A crystallization accelerator uncoated region
15B crystallization accelerator uncoated region
20 single crystal pull-up apparatus
21 chamber
21a main chamber
21b pull chamber
21c gas inlet port
21d gas exhaust port
21e sight window
22 carbon susceptor
23 rotary shaft
24 shaft driving mechanism
25 heater
26 heat insulation material
27 heat-shield body
27a opening of heat-shield body
28 crystal pull-up wire
29 wire winding mechanism
30 CCD camera
31 image processing unit
32 controller
40 rotary stage
41 polyethylene sheet (PE sheet)
41e end portion of polyethylene sheet
42 polypropylene band (PP band)
43 rubber band
45 spray

What is claimed is:

1. A quartz glass crucible used for pulling up a silicon single crystal by a Czochralski method, comprising:
 a cylindrical crucible body which has a bottom and is made of quartz glass; and
 a crystallization-accelerator-containing coating film which is formed on an outer surface of the crucible body so as to cause an outer crystal layer composed of an aggregate of dome-shaped or columnar crystal grains to be formed on a surface-layer portion of the outer surface of the crucible body by heating during a step of pulling up the silicon single crystal,
 wherein the crystallization-accelerator-containing coating film is a non-heated polymer film formed of: (i) a barium compound which is insoluble in water, and (ii) a thickener composed of a polymer in which the barium compound diffuses.

2. The quartz glass crucible according to claim 1,
 wherein a ratio A/B between a maximum value A of a peak intensity at a diffraction angle 2θ of 20° to 25° and a maximum value B of a peak intensity at a diffraction angle 2θ of 33° to 40° obtained by analyzing the outer surface of the crucible body, on which the outer crystal layer is formed, by an X-ray diffraction method is 7 or less.

3. The quartz glass crucible according to claim 2, wherein the ratio A/B between the maximum value A of the peak intensity at the diffraction angle 2θ of 20° to 25° and the maximum value B of the peak intensity at the diffraction angle 2θ of 33° to 40° obtained by analyzing the outer surface of the crucible body, on which the outer crystal layer is formed, by the X-ray diffraction method is 0.4 or more and 7 or less.

4. The quartz glass crucible according to claim 1, wherein a region having a predetermined width extending downward from a rim of the upper end of the outer surface of the crucible body is a crystallization-accelerator uncoated region in which the crystallization-accelerator-containing coating film is not formed.

* * * * *